US006352777B1

(12) United States Patent
Bulovic et al.

(10) Patent No.: US 6,352,777 B1
(45) Date of Patent: Mar. 5, 2002

(54) ORGANIC PHOTOSENSITIVE OPTOELECTRONIC DEVICES WITH TRANSPARENT ELECTRODES

(75) Inventors: Vladimir Bulovic, Metuchen; Stephen R. Forrest, Princeton, both of NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/136,342

(22) Filed: Aug. 19, 1998

(51) Int. Cl.$^7$ .......................................... H01L 31/0256
(52) U.S. Cl. .................... 428/411.1; 428/913; 313/523; 257/184; 257/461; 250/200; 136/263
(58) Field of Search ................................. 250/200, 215; 136/243, 252, 263; 257/184, 431, 449, 461, 464; 313/523, 540; 428/411.1, 458, 469, 913

(56) References Cited

U.S. PATENT DOCUMENTS

| | | | | |
|---|---|---|---|---|
| 3,789,216 | A | * | 1/1974 | Domp |
| 3,900,945 | A | * | 8/1975 | Kay et al. |
| 4,060,426 | A | * | 11/1977 | Zinchuk |
| 4,125,414 | A | | 11/1978 | Tang et al. |
| 4,164,431 | A | | 8/1979 | Tang |
| 4,255,211 | A | | 12/1979 | Fraas |
| 4,281,053 | A | | 7/1981 | Tang ............................ 430/58 |
| 4,773,944 | A | | 9/1988 | Nath et al. ................... 136/249 |
| 4,992,109 | A | | 2/1991 | Yoshikawa et al. .......... 136/263 |
| 5,315,129 | A | | 5/1994 | Forrest et al. ................. 257/21 |
| 5,331,183 | A | * | 7/1994 | Sariciftci et al. .............. 257/40 |
| 5,350,459 | A | | 9/1994 | Suzuki et al. ................ 136/263 |
| 5,457,565 | A | | 10/1995 | Namiki et al. ............... 359/273 |
| 5,703,436 | A | | 12/1997 | Forrest et al. ............... 313/506 |
| 5,714,838 | A | | 2/1998 | Haight et al. ................ 313/506 |
| 5,953,587 | A | | 9/1999 | Forrest et al. ................. 438/99 |
| 6,013,538 | A | | 1/2000 | Burrows et al. .............. 438/22 |
| 6,198,091 | B1 | * | 3/2001 | Forrest et al. ............ 250/214.1 |
| 6,198,092 | B1 | * | 3/2001 | Bulovic et al. .......... 250/214.1 |
| 6,278,055 | B1 | * | 8/2001 | Forrest et al. ............... 136/263 |

FOREIGN PATENT DOCUMENTS

JP            61-251084         11/1986

OTHER PUBLICATIONS

M. Hiramoto et al., "Effect of Thin Gold Interstitial–layer on the Photovoltaic Properties of Tandem Organic Solar Cell", Chemistry Letters, pp. 327–330 (1990), (no month given).
N. Karl et al, "Efficient Organic Photovoltaic Cells, The Role of Excitonic Light Collection, Exciton Diffusion to Interfaces, Internal Fields for Charge Separation, and High Charge Carrier Mobilities", Mol. Cryst. Liq. Cryst., vol. 252, pp. 243–258 (1994), (no month given).
G. Jorgensen et al., "Polymers for Solar–Energy Devices", American Chemical Society, Desk Reference of Functional Polymers. Syntheses and Applications, Chapter 4.2, pp. 567–588 (1977), (no month given).
J. Kanicki, Polymeric Semiconductor Contacts and Photovoltaic Applications, Handbook of Conducting Polymers, vol. 1, Chapter 17, pp. 544–660 (1986), (no month given).
C. Arbour et al., "Surface Chemistries And Photoelectrochemistries Of Thin Film Molecular Semiconductor Materials", Mol. Cryst. Liq. Cryst., vol. 183, pp. 307–320 (1990), (no month given).
J.B. Whitlock et al., "Investigations of Materials and Device Structures for Organic Semiconductor Solar Cells", Optical Engineering, vol. 32, No. 8, pp. 1921–1934 (Aug. 1993).
S.R. Forrest et al., "Optical And Electrical Properties of Isotype Crystalline Molecular Organic Heterojunctions", J. Appl. Phys. vol. 66, No. 12, pp. 5908–5914 (Dec. 1989).
G. Yu, et al., "Photovoltaic Cells Made With Organic Composites", Proceedings of the Future Generation Photovoltaic Technologies: First NREL Conference, Mar. 1997, American Inst. of Physics, pp. 317–324.
V. Bulovic et al., "Photovoltaic Cells Based on Vacuum Deposited Molecular Organic Thin Films", Proceedings of the Future Generation Photovoltaic Technologies: First NREL Conference, Mar. 1997, American Inst. of Physics, pp. 235–242.
National Renewal Energy Laboratory, Research Opportunities in Photochemical Science—Workshop Proceedings—Panel A–1 "Photo Electrochemical and Organic–Based Solar Cells" pp. 142–185, Estes Park, CO, Feb. 5–8, 1996, NREL/CP–450–21097, DE96007867.
G. Yu et al., "Semiconducting Polymers as Materials for Device Applications", 23rd Int'l Conf. On The Physics of Semiconductors, vol. 1, pp. 35–42, World Scientific, Berlin, Germany, Jul. 21–26, 1996.
Uni–Solar® Energy Generation, http://ovonic.com/engentek.html (Jan. 26, 1998).
S.R. Forrest, "Very High Efficiency Photovoltaic Cells Based on Fully Organic Multiple Quantum Wells", National Renewable Energy Lab, Quarterly Technical Progress Report, Feb. 15, 1995–May 15, 1995, (Mar. 1997) NREL/SR–520–21882, DE97000063.
S.R. Forrest, "Ultrathin Organic Films by Organic Molecular Beam Deposition and Related Techniques," Chemical Reviews, American Chemical Society, vol. 97, No. 6, pp. 1793–1896, Sep./Oct. 1997.

* cited by examiner

Primary Examiner—Marie Yamnitzky
(74) Attorney, Agent, or Firm—Kenyon & Kenyon

(57) ABSTRACT

An organic photosensitive optoelectronic device optimized to enhance desired characteristics such as external quantum efficiency is described. The photosensitive optoelectronic device has at least two transparent electrodes and one or more organic photoconductive layers disposed between the transparent electrodes. In other embodiments photosensitive optoelectronic devices with multilayer photoconductive structures and photosensitive optoelectronic devices with a reflective layer are disclosed.

9 Claims, 21 Drawing Sheets

Prior Art

ORGANIC PHOTOSENSITIVE OPTOELECTRONIC DEVICES WITH TRANSPARENT ELECTRODES

FIELD OF INVENTION

The present invention generally relates to organic thin-film photosensitive optoelectronic devices. More specifically, it is directed to organic photosensitive optoelectronic devices, e.g., solar cells and photodetectors, having transparent electrodes. Further, it is directed to organic photosensitive optoelectronic devices having a transparent cathode which forms a low resistance interface with the adjacent organic semiconductor layer. Further, it is directed to an organic photosensitive optoelectronic device consisting of a plurality of stacked photosensitive optoelectronic subcells, each subcell having one or more photosensitive optoelectronically active layers and transparent charge transfer layers.

BACKGROUND OF THE INVENTION

Optoelectronic devices rely on the optical and electronic properties of materials to either produce or detect electromagnetic radiation electronically or to generate electricity from ambient electromagnetic radiation. Photosensitive optoelectronic devices convert electromagnetic radiation into electricity. Solar cells, also known as photovoltaic (PV) devices, are specifically used to generate electrical power. PV devices are used to drive power consuming loads to provide, for example, lighting, heating, or to operate electronic equipment such as computers or remote monitoring or communications equipment. These power generation applications also often involve the charging of batteries or other energy storage devices so that equipment operation may continue when direct illumination from the sun or other ambient light sources is not available. As used herein the term "resistive load" refers to any power consuming or storing device, equipment or system. Another type of photosensitive optoelectronic device is a photoconductor cell. In this function, signal detection circuitry monitors the resistance of the device to detect changes due to the absorption of light. Another type of photosensitive optoelectronic device is a photodetector. In operation a photodetector has a voltage applied and a current detecting circuit measures the current generated when the photodetector is exposed to electromagnetic radiation. A detecting circuit as described herein is capable of providing a bias voltage to a photodetector and measuring the electronic response of the photodetector to ambient electromagnetic radiation. These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

Traditionally, photosensitive optoelectronic devices have been constructed of a number of inorganic semiconductors, e.g. crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation of selected spectral energies to generate electric charge carriers. Solar cells are characterized by the efficiency with which they can convert incident solar power to useful electric power. Devices utilizing crystalline or amorphous silicon dominate commercial applications and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. More recent efforts have focused on the use of organic photovoltaic cells to achieve acceptable photovoltaic conversion efficiencies with economical production costs.

PV devices typically have the property that when they are connected across a load and are irradiated by light they produce a photogenerated voltage. When irradiated without any external electronic load, a PV device generates its maximum possible voltage, V open-circuit, or $V_{OC}$. If a PV device is irradiated with its electrical contacts shorted, a maximum short-circuit current, or $I_{SC}$, is produced. When actually used to generate power, a PV device is connected to a finite resistive load and the power output is given by the current voltage product, I×V. The maximum total power generated by a PV device is inherently incapable of exceeding the product, $I_{SC} \times V_{OC}$. When the load value is optimized for maximum power extraction, the current and voltage have values, $I_{max}$ and $V_{max}$ respectively. A figure of merit for solar cells is the fill factor ff defined as:

$$ff = \frac{I_{max} V_{max}}{I_{SC} V_{OC}} \quad (1)$$

where ff is always less than 1 since in actual use $I_{SC}$ and $V_{OC}$ are never obtained simultaneously. Nonetheless, as ff approaches 1, the device is more efficient.

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0 + h\nu \rightarrow S_0^*$. Here $S_0$ and $S_0^*$ denote ground and excited molecular states, respectively. This energy absorption is associated with the promotion of an electron from a bound state in the valence band, which may be a π-bond, to the conduction band, which may be a π* -bond, or equivalently, the promotion of a hole from the conduction band to the valence band. In organic thin-film photoconductors, the generated molecular state is generally believed to be an exciton, i.e., an electron-hole pair in a bound state which is transported as a quasi-particle. The excitons can have an appreciable life-time before geminate recombination, which refers to the process of the original electron and hole recombining with each other as opposed to recombination with holes or electrons from other pairs. To produce a photocurrent the electron-hole pair must become separated. If the charges do not separate, they can recombine in a geminate recombination process, either radiatively—re-emitting light of a lower than incident light energy—, or non-radiatively—with the production of heat.

Either of these outcomes is undesirable in a photosensitive optoelectronic device. While exciton ionization, or dissociation, is not completely understood, it is generally believed to occur in regions of electric field occurring at defects, impurities, contacts, interfaces or other inhomogeneities. Frequently, the ionization occurs in the electric field induced around a crystal defect, denoted, M. This reaction is denoted $S_0^* + M \rightarrow e^- h^+$. If the ionization occurs at a random defect in a region of material without an overall electric field, the generated electron-hole pair will likely recombine. To achieve a useful photocurrent, the electron and hole must be collected separately at respective opposing electrodes, which are frequently referred to as contacts. This is achieved with the presence of an electric field in the region occupied by the carriers. In power generation devices, i.e., PV devices, this is preferably achieved with the use of internally produced electric fields that separate the generated photocarriers. In other photosensitive optoelectronic devices, the electric field may be generated by an external bias, e.g., in a photoconductor cell, or as a result of the superposition of internally and externally generated electric fields, e.g., in a photodetector. In an organic PV device, as in other photosensitive optoelectronic devices, it is desirable to separate as many of the photogenerated electron-hole pairs, or excitons, as possible. The built-in electric field serves to dissociate the excitons to produce a photocurrent.

FIG. 1 schematically depicts the photoconductive process in organic semiconducting materials. Step 101 shows electromagnetic radiation incident upon sample of photoconductive material between two electrodes a and b. In step 102, a photon is absorbed to generate an exciton, i.e., electron-hole pair, in the bulk. The solid circle schematically represents an electron while the open circle schematically represents a hole. The curving lines between the hole and electron are an artistic indication that the electron and hole are in an excitonic bound state. In step 103, the exciton diffuses within the bulk photoconductive material as indicated by the exciton's closer proximity to electrode a. The exciton may suffer recombination in the bulk material away from any field associated with a contact or junction as indicated in step 104. If this occurs the absorbed photon does not contribute to the photocurrent. Preferably the exciton ionizes within the field associated with a contact or junction as indicated by the progression from step 103 to step 105. However, it is still possible for the newly liberated carriers to recombine as indicated in step 106 before permanently separating and contributing to the photocurrent. Preferably the carriers separate and respond to the field near a contact or junction according to the sign of their electric charge as indicated by the progression from step 105 to step 107. That is, in an electric field, indicated by $\epsilon$ in step 107, holes and electrons move in opposite directions.

To produce internally generated electric fields which occupy a substantial volume, the usual method is to juxtapose two layers of material with appropriately selected conductive properties, especially with respect to their distribution of molecular quantum energy states. The interface of these two materials is called a photovoltaic heterojunction. In traditional semiconductor theory, materials for forming PV heterojunctions have been denoted as generally being of either n, or donor, type or p, or acceptor, type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photogenerated, majority carrier concentration depends primarily on unintentional doping by defects or impurities. The type and concentration of impurities determine the value of the Fermi energy, or level, within the gap between the highest occupied molecular orbital (HOMO) and the lowest unoccupied molecular orbital (LUMO), called the HOMO-LUMO gap. The Fermi energy characterizes the statistical occupation of molecular quantum energy states denoted by the value of energy for which the probability of occupation is equal to ½. A Fermi energy near the LUMO energy indicates that electrons are the predominant carrier. A Fermi energy near the HOMO energy indicates that holes are the predominant carrier. Accordingly, the Fermi energy is a primary characterizing property of traditional semiconductors and the prototypical PV heterojunction has traditionally been the p-n interface.

In addition to relative free-carrier concentrations, a significant property in organic semiconductors is carrier mobility. Mobility measures the ease with which a charge carrier can move through a conducting material in response to an electric field. As opposed to free carrier concentrations, carrier mobility is determined in large part by intrinsic properties of the organic material such as crystal symmetry and periodicity. Appropriate symmetry and periodicity can produce higher quantum wavefunction overlap of HOMO levels producing higher hole mobility, or similarly, higher overlap of LUMO levels to produce higher electron mobility. Moreover, the donor or acceptor nature of an organic semiconductor, e.g., 3,4,9,10-perylenetetracarboxylic dianhydride (PTCDA), may be at odds with the higher carrier mobility. For example, while chemistry arguments suggest a donor, or n-type, character for PTCDA, experiments indicate that hole mobilities exceed electron mobilities by several orders of magnitude so that the hole mobility is a critical factor. The result is that device configuration predictions from donor/acceptor criteria may not be borne out by actual device performance. Thus, in selecting organic materials such as those described herein for photosensitive optoelectronic devices, it has been found that isotype heterojunctions, e.g, p-p, may have rectifying properties as good as traditional p-n type heterojunctions, although true p-n type is generally preferable when possible. Isotype heterojunctions are discussed further below. Due to these unique electronic properties of organic materials, rather than designating them as "p-type" or "n-type", the nomenclature of "hole-transporting-layer" (HTL) or "electron-transporting-layer" (ETL) is frequently used. In this designation scheme, an ETL will preferentially be electron conducting and an HTL will preferentially be hole transporting. The term "rectifying" denotes, inter alia, that an interface has an asymmetric conduction characteristic, i.e., the interface supports electronic charge transport preferably in one direction. Rectification is associated normally with a built-in electric field which occurs at the heterojunction between appropriately selected materials.

The electrodes, or contacts, used in a photosensitive optoelectronic device are an important consideration. In a photosensitive optoelectronic device, it is desirable to allow the maximum amount of ambient electromagnetic radiation from the device exterior to be admitted to the photoconductively active interior region. That is, it is desirable to get the electromagnetic radiation to where it can be converted to electricity by photoconductive absorption. This indicates that at least one of the electrical contacts should be minimally absorbing and minimally reflecting of the incident electromagnetic radiation. That is, the contact should be substantially transparent. When used herein, the terms "electrode" and "contact" refer only to layers that provide a medium for delivering photogenerated power to an external circuit or providing a bias voltage to the device. That is, an electrode, or contact, provides the interface between the photoconductively active regions of an organic photosensitive optoelectronic device and a wire, lead, trace or other means for transporting the charge carriers to or from the external circuit. The term "charge transfer layer" is used herein to refer to layers similar to but different from electrodes in that a charge transfer layer only delivers charge carriers from one subsection of an optoelectronic device to the adjacent subsection. As used herein, a layer of material or a sequence of several layers of different materials is said to be "transparent" when the layer or layers permit at least 50% of the ambient electromagnetic radiation in relevant wavelengths to be transmitted through the layer or layers.

When an electrode or charge transfer layer provides the primary mechanism for photovoltaic charge separation, the device is called a Schottky device as discussed further below.

Electrodes or contacts are usually metals or "metal substitutes". Herein the term "metal" is used to embrace both materials composed of an elementally pure metal, e.g., Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include wide bandgap semiconductors, for example, transparent conducting oxides such as indium tin oxide (ITO), tin oxide (TO), gallium indium tin oxide (GITO), zinc oxide (ZO) and zinc indium tin oxide (ZITO). In particular, ITO is a highly doped degenerate n+ semiconductor with an optical bandgap of approximately 3.2 eV rendering it transparent to wavelengths greater than approximately 3900 Å. Another suitable metal substitute material is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to by one or more of the inventors of the present invention as "metal-free" wherein the term "metal-free" is expressly meant to embrace a material free of metal in its chemically uncombined form. Free metals typically have a form of metallic bonding that may be thought of as a type of chemical bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. Further, these metal substitutes do not have their Fermi level in a band of conducting states in contrast with true metals. When metals are present in their metallic form, the electronic conduction band tends to provide, among other metallic properties, a high electrical conductivity as well as a high reflectivity for optical radiation. Another characteristic of metallic conductors is the temperature dependence of their conductivity. Metals generally have a high conductivity at room temperature which increases as the temperature is lowered to near absolute zero. Metal substitutes, for example, semiconductors including, inter alia, inorganic, organic, amorphous, or crystalline, generally have conductivities which decrease as their temperature is lowered to near absolute zero.

There are two basic organic photovoltaic device configurations. The first type is the Schottky-type cell with a single species of organic photoconductive material sandwiched between a pair of metal and/or metal substitute contacts. Conventionally, for n-type photoconductors, a high work function metal, e.g., Au, has been used as the Schottky contact, and for p-type photoconductors, a metal with a low work function, e.g., Al, Mg, or In has been used as the Schottky contact. The charge separation desired in a PV device is induced by exciton dissociation in the space-charge region associated with the built-in electric field at the metal/photoconductor interface. Conventionally, such a device requires different metal or metal substitute pair combinations as contacts since use of the same material at both interfaces would ostensibly produce opposing rectifying junctions. If the same material is used for both electrodes it has been generally thought that the fields generated at the photoconductor-electrode interfaces are necessarily equal in magnitude and opposite in direction so that no net photocurrent is generated in the absence of an external applied voltage. While it is possible for charge separation to occur at both interfaces and be additive, it is generally preferable to have all charge separation occurring at one interface. For example, this can be achieved if the non-rectifying interface has little or no barrier to carrier transport, i.e., if it is a relatively low resistance contact. This may also be referred to as an "ohmic" contact. In any event, in photosensitive optoelectronic devices it is generally desirable that the interfaces either contribute to the net charge separating action or present the smallest possible resistance or barrier to carrier transport.

A sample prior art organic Schottky device is shown schematically in FIG. 2A. Contact 2A01 is Ag; organic photoconductive layer 2A02 is PTCDA; and contact 2A03 is ITO. Such a cell was described in an article by N. Karl, A. Bauer, J Holzäofel, J Marktanner, M Möbus, and F. Stölzle, "*Efficient Organic Photovoltaic Cells: The Role of Excitonic Light Collection, Exciton Diffusion to Interfaces, Internal Fields for Charge Separation, and High Charge Carrier Mobilities*", Molecular Crystals and Liquid Crystals, Vol. 252, pp 243–258, 1994 (hereinafter Karl et al.). Karl et al. noted that while the Ag electrode 2A01 was photovoltaically active in such a cell, the ITO electrode very rarely was photoactive and further that the indications of photovoltaic action at the ITO electrode had poor statistical certainty. Further, one of ordinary skill in the art would expect contact 2A01 not to be transparent.

The second type of photovoltaic device configuration is the organic bilayer cell. In the bilayer cell, charge separation predominantly occurs at the organic heterojunction. The built-in potential is determined by the HOMO-LUMO gap energy difference between the two materials contacting to form the heterojunction. An isotype heterojunction has been discussed in an article by S. R. Forrest, L. Y Leu, F. F. So, and W. Y. Yoon, "*Optical and Electrical Properties of Isotype Crystalline Molecular Organic Heterojunctions*" Journal of Applied Physics, Vol. 66, No. 12, 1989 (hereinafter "Forrest, Leu et al.") and in an article by Forrest, S. R., "*Ultrathin Organic Films Grown by Organic Molecular Beam Deposition and Related Techniques*" Chemical Reviews, Vol. 97, No. 6, 1997 (hereinafter Forrest, Chem. Rev. 1997) both of which are incorporated herein by reference. Forrest, Leu et al. describe two isotype solar cells depicted in FIG. 2B and FIG. 2C. FIG. 2B shows a device consisting of an ITO electrode 2B02 on a substrate 2B01 covered with a layer 2B03 of copper phthalocyanine (CuPc) and a layer 2B04 of PTCDA with a top electrode 2B05 of In. In a second device, with reference to FIG. 2C, an ITO electrode 2C02 is again placed on a substrate 2C01. Then a CuPc layer 2C03 and a 3,4,9,10-perylenetetracarboxylic-bis-benzimidazole (PTCBI) layer 2C04 are placed in order with a Ag electrode 2C05 on top. This prior art had only one transparent electrode and it was on the bottom of the device. It was also noted in this reference that these organic photovoltaic devices suffered from a high series resistance.

As in the case of Schottky devices, unless an interface, at a contact, for example, is contributing to the charge separation, it is desirable that the interface produce the smallest possible obstruction to free current flow. In bilayer devices, since the dominant charge separating region is located near the heterojunction, it is desirable for the interfaces at the electrodes to have the smallest possible resistance. In particular, it is known in the art to use thin metal layers as low resistance, or ohmic, electrodes, or contacts. When ohmic contacts are desired, a high work function metal, e.g., Au, has been used as the positive electrode, i.e., anode, in photosensitive optoelectronic devices. Similarly, a low work function metal, e.g., Al, Mg, or In, has been used to make an ohmic negative electrode, i.e., cathode.

Herein, the term "cathode" is used in the following manner. In a PV device under ambient irradiation and connected with a resistive load and with no externally applied voltage, e.g., a solar cell, electrons move to the cathode from the adjacent photoconducting material. With an applied bias voltage, electrons may move from the cathode to the adjacent photoconducting material, or vice versa, depending on the direction and magnitude of the applied voltage. For example, under "forward-bias" a negative bias is applied to the cathode. If the magnitude of the forward-bias equals that of the internally generated potential there will be no net current through the device. If the forward-bias potential exceeds the internal potential in magnitude there will be a current in the opposite direction from the non-biased situation. In this later forward-bias situation, electrons move from the cathode into the adjacent photoconductive organic layer. Under "reverse-bias", a positive bias is applied to the cathode and any electrons which can move do so in the same direction as in the no bias situation. A reverse-biased device generally has little or no current flow until it is irradiated. Similarly, the term "anode" is used herein such that in a solar cell under illumination, holes move to the anode from the adjacent photoconducting material, which is equivalent to electrons moving in the opposite manner. The application of an external voltage to the device structure will alter the flow of the carriers at the anode/photoconductor interface in a complementary fashion to that described for the cathode and in a manner understood by those of ordinary skill in the art. It will be noted that as the terms are used herein anodes and cathodes may be electrodes or charge transfer layers.

Further, as discussed above, in non-Schottky photosensitive optoelectronic devices it is similarly desirable for the electrodes not merely to form ohmic contacts but also to have high optical transparency. Transparency requires both low reflectivity and low absorption. Metals have the desired low resistance contact properties; however, they can produce significant conversion efficiency reductions due to reflection of ambient radiation away from the device. Also, metal electrodes can absorb significant amounts of electromagnetic radiation, especially in thick layers. Therefore, it has been desirable to find low resistance, high transparency electrode materials and structures. In particular, the metal substitute ITO has the desired optical properties. It is also known in the art that ITO functions well as an anode in organic optoelectronic devices. However, it had not been previously thought that ITO or other metal substitutes could make low resistance cathodes for organic optoelectronic devices. Solar cells had been disclosed in which a highly transparent ITO layer may have functioned as a cathode in some cases, but such ITO cathodes were only disclosed as having been prepared by depositing the charge-carrying organic layer onto the ITO layer by Karl et al. and Whitlock, J. B., Panayotatos, P., Sharma, G.D., Cox, M. D., Savers, R. R., and Bird, G. R., "*Investigations of Materials and Device Structures for Organic Semiconductor Solar Cells*", "Optical Eng., Vol. 32, No. 8, 1921–1934 (August 1993), (Whitlock et al).

Prior art PV devices, e.g., FIG. 2A and 2B, have only utilized non-metallic materials, e.g., indium tin oxide (ITO), as one electrode of the photovoltaic device. The other electrode has traditionally been a non-transparent metallic layer, e.g., aluminum, indium, gold, tin, silver, magnesium, lithium, etc. or their alloys, selected on the basis of work function as discussed above. U.S. Pat. No. 5,703,436 to Forrest, S. R. et al. (hereinafter Forrest '436), incorporated herein by reference, describes a technique for fabricating organic photoemissive devices (TOLEDs: Transparent Organic Light Emitting Diodes) having a transparent cathode deposited onto an organic ETL by depositing a thin metallic layer, e.g., Mg:Ag, onto the organic ETL and then sputter depositing an ITO layer onto the Mg:Ag layer. Such a cathode having the ITO layer sputter deposited onto a Mg:Ag layer is referred to herein as a "composite ITO/Mg:Ag cathode". The composite ITO/Mg:Ag cathode has high transmission as well as low resistance properties.

It is known in the art of inorganic solar cells to stack multiple photovoltaic cells to create an inorganic multisection solar cell with transparent metallic layers. For example, U.S. Pat. No. 4,255,211 to Frass (hereinafter "Frass '211") discloses a stacked cell arrangement. However, the photolithographic techniques used to fabricate inorganic electronic devices are typically inapplicable to production of organic optoelectronic devices. Photolithography generally involves deposition of metallic layers and inorganic semiconductive layers followed by additional steps of masking and etching. The etching steps involve use of strong solvents which can dissolve the relatively fragile organic semiconductor materials that are suitable for organic photovoltaic devices. Therefore, organic photosensitive optoelectronic device fabrication techniques typically avoid this type of liquid etching process in which deposited material is removed after an organic layer has been deposited. Instead, device layers are generally deposited sequentially with techniques such as evaporation or sputtering. Access to electrodes is generally implemented using masking or dry etching during deposition. This constraint presents a challenge to fabrication of a stacked organic optoelectronic device for which electrode access to the intervening layers in the stack is desired. Thus, it is believed that all prior art stacked cells have the individual photovoltaic cells electrically connected internally and only in series.

For inorganic photovoltaic devices, series connection is not particularly disadvantageous. However, due to the high series resistance of the organic photovoltaic devices noted above, a series configuration is undesirable for power applications due to the reduced efficiency. Forrest, Chem. Rev. 1997 reported that high series resistance in organic solar cells leads to space-charge build-up as power levels are raised with increasing incident light intensity. This leads to degradation of the photocurrent, $I_{max}$ effectively reducing the fill factor and therefore the efficiency. Moreover, what is believed to be the only previously disclosed organic solar cell with more than one photovoltaic subcell was a tandem, i.e., two PV subcells, with the subcells connected in series. See Effect of Thin Gold Interstitial-layer on the Photovoltaic Properties of Tandem Organic Solar Cell, Hiramoto, M; Suezaki, M; Yokoyama, M; Chemistry Letters 1990, 327 (hereinafter "Hiramoto"). Referring to FIG. 2D, substrate 2D01 is glass; 2D02 is ITO; 2D03 is Me-PTC (500 Å); 2D04 is $H_2Pc$ (700 Å); 2D05 is Au(<30 Å); 2D06 is Me-PTC (700 Å); $H_2Pc$ (700 Å); and 2D07 is Au (200 Å). This device has the subcells electrically connected internally and in series, thus avoiding the problem of devising a means to make external contact to an electrode within the middle of a stack of organic semiconducting material. Hiramoto's organic tandem devices have just two electrodes: one on top and bottom used to make external connections plus charge transfer layer 2D05 which electrically "floats" between the two subcells ". Only one of the electrodes, bottom ITO layer 2D02 was transparent. Top Au layer 2D07 was 200 Å thick and therefore non-transparent. Further, for the reasons noted above, series connection is not an optimal configuration in stacked organic photovoltaic devices for high power applications.

A solar cell may be viewed as a photodiode with no applied bias. The internal electric field generates a photocurrent when light is incident on the solar cell and the current drives a resistive load for the extraction of power. On the other hand, a photodetector may be viewed as a diode with no externally applied bias voltage or a finite externally applied bias voltage. When electromagnetic radiation is incident upon a photodetector with a bias, the current increases from its dark value to a value proportional to the number of photogenerated carriers and the increase may be measured with external circuitry. If a photodiode is operated with no applied bias, an external circuit may be used to measure the photogenerated voltage and achieve photodetection. While the same general configuration of electrodes, charge transfer layers and photoconductive layers may be used alternatively as a solar cell or as a photodetector, a configuration optimized for one purpose is generally not optimal for another. For example, photosensitive optoelectronic devices produced as solar cells are designed to convert as much of the available solar spectrum as possible to electricity. Therefore, a broad spectral response over the entire visible spectrum is desirable. On the other hand, a photodetector may be desired which has a photosensitive response over a narrow spectral range or over a range outside the visible spectrum.

Organic PV devices typically have relatively low quantum yield (the ratio of photons absorbed to carrier pairs generated, or electromagnetic radiation to electricity conversion efficiency), being on the order of 1% or less. This is in part thought to be due to the second order nature of the intrinsic photoconductive process, that is, carrier generation requires exciton generation, diffusion and ionization, as described above. In order to increase these yields, materials and device configurations are desirable which can enhance the quantum yield and, therefore, the power conversion efficiency.

Forrest Chem. Rev. 1997 and Arbour, C., Armstrong, N. R., Brina, R., Collins, G., Danziger, J. -P., Lee, P., Nebesny, K. W., Pankow, J, Waite, S., "*Surface Chemistries and Photoelectrochemistries of Thin Film Molecular Semiconductor Materials*" *Molecular Crystals and Liquid Crystals,* 1990, 183, 307, (hereinafter Arbour et al.), incorporated herein by reference in its entirety, disclose that alternating thin multilayer stacks of similar type photoconductors could be used to enhance photogenerated carrier collection efficiency over that using a single layer structure. Further, these sources describe multiple quantum well MQW) structures in which quantum size effects occur when the layer thicknesses become comparable to the exciton dimensions.

SUMMARY AND OBJECTS OF INVENTION

The present invention is directed to organic photosensitive optoelectronic devices utilizing transparent electrodes, in particular, devices that include an organic photosensitive optoelectronic cell comprised of at least one pair of two transparent electrodes, that is, a transparent cathode and a transparent anode, or devices that have a transparent electrode in superposed relationship upon the top surface of a substrate with at least one photoconductive organic layer disposed between the electrode and the substrate. More specifically, the organic photosensitive optoelectronic devices of the present invention may be comprised of a transparent cathode that is highly transparent and/or highly efficient. As representative embodiments, such transparent cathodes may be the highly transparent, highly efficient and/or low resistance non-metallic or metallic/non-metallic composite cathodes, such as disclosed in the co-pending application Ser. No. 08/964,863 hereinafter "parthasarathy Appl. '836" and 09/054,707 hereinafter "Parthasarathy Appl. '707" or in Forrest '436, each of which being incorporated in its entirety by reference.

The organic photosensitive optoelectronic devices of the present invention may function as a solar cell, photodetector or photocell. Whenever the organic photosensitive optoelectronic devices of the present invention function as solar cells, the materials used in the photoconductive organic layer or layers and the thicknesses thereof may be selected, for example, to optimize the external quantum efficiency of the device. Whenever the organic photosensitive optoelectronic devices of the present invention function as photodetectors or photocells, the materials used in the photoconductive organic layer or layers and the thicknesses thereof may be selected, for example, to maximize the sensitivity of the device to desired spectral regions. In each case, use of transparent electrodes, or even only a transparent top electrode, makes it possible for substantially higher external quantum efficiencies and/or photosensitivities in selected spectral regions to be realized compared to when one or more of the electrodes can cause substantial transmission losses due to absorption and/or reflection losses.

In addition to the organic photosensitive optoelectronic devices that may be comprised of two transparent electrodes or a transparent top electrode, the present invention is further directed to organic photosensitive optoelectronic devices having the unique geometric and electrical configurations that may be fabricated using stacked cells with transparent electrodes. In particular, the organic photosensitive optoelectronic device may be a stacked device comprised of a plurality of subcells in superposed relation to each other on the surface of a substrate. The materials and thicknesses of the individual subcells may be selected, for example, together with selecting the total number of subcells that are included in the stacked photosensitive optoelectronic device, so as to optimize the external quantum efficiency of the photosensitive optoelectronic device.

In particular, for stacked photosensitive optoelectronic devices configured to be electrically connected in parallel, the thicknesses of the individual subcells may be adjusted so that in combination with selecting the total number of subcells in the stacked device, the external quantum efficiency of the device may be optimized so as to obtain an external quantum efficiency that is higher than that which is possible for a single cell. The term "external quantum efficiency" is used herein to refer to the efficiency with which a photosensitive optoelectronic device is capable of converting the total incident radiation into electrical power, as distinct from the term "internal quantum efficiency," which is used herein to refer to the efficiency with which a photosensitive optoelectronic device is capable of converting the absorbed radiation into electrical power. Using these terms, a stacked photosensitive optoelectronic device with an electrically parallel configuration may be designed to achieve an external quantum efficiency, under a given set of ambient radiation conditions, that approaches the maximum internal quantum efficiency that may be achieved for an individual subcell under such ambient conditions.

This result may be achieved by considering several guidelines that may be used in the selection of layer thicknesses. It is desirable for the exciton diffusion length, $L_D$, to be greater than or comparable to the layer thickness, L, since it is believed that most exciton dissociation will occur at an interface. If $L_D$ is less than L, then many excitons may recombine before dissociation. It is further desirable for the total photoconductive layer thickness to be of the order of the electromagnetic radiation absorption length, $1/\alpha$ (where $\alpha$ is the absorption coefficient), so that nearly all of the radiation incident on the solar cell is absorbed to produce excitons. However, the layer thicknesses should not be so large compared to the extent of the heterojunction electric fields that many excitons get generated in a field-free region. One reason for this is that the fields help to dissociate the excitons. Another reason is that if an exciton dissociates in a field-free region, it is more likely to suffer geminant recombination and contribute nothing to the photocurrent. Furthermore, the photoconductive layer thickness should be as thin as possible to avoid excess series resistance due to the high bulk resistivity of organic semiconductors.

Accordingly, these competing guidelines inherently require tradeoffs to be made in selecting the thickness of the photoconductive organic layers of a photosensitive optoelectronic cell. Thus, on the one hand, a thickness that is comparable or larger than the absorption length is desirable in order to absorb the maximum amount of incident radiation. On the other hand, as the photoconductive layer thickness increases, two undesirable effects are increased. One is that due to the high series resistance of organic semiconductors, an increased organic layer thickness increases device resistance and reduces efficiency. Another undesirable effect is that increasing the photoconductive layer thickness increases the likelihood that excitons will be generated far from the effective field at a charge-separating interface, resulting in enhanced probability of geminate recombination and, again, reduced efficiency. Therefore, a device configuration is desirable which balances between these competing effects in a manner that produces a high quantum efficiency for the overall device.

In particular, by taking the above-noted competing effects into account, that is, the absorption length of the photoconductive materials in the device, the diffusion length of the excitons in these materials, the photocurrent generation efficiency of these excitons, and the resistivity of these materials, the thickness of the layers in an individual cell may be adjusted so as to obtain a maximum internal quantum efficiency for those particular materials for a given set of ambient radiation conditions. Since the diffusion length of the excitons tends to have a relatively small value and the resistivity of typical photoconductive materials tends to be relatively large, an optimal subcell with respect to achieving the maximum internal quantum efficiency would typically be a relatively thin device. However, since the absorption length for such photoconductive organic materials tends to be relatively large as compared with the exciton diffusion length, such thin optimal photosensitive optoelectronic subcells, which may have the maximum internal quantum efficiency, would tend to have a relatively low external quantum efficiency, since only a small fraction of the incident radiation would be absorbed by such optimal subcells.

So as to improve the external quantum efficiency of an individual subcell, the thickness of the photoconductive organic layers may be increased so as to absorb significantly more incident radiation. Although the internal quantum efficiency for converting the additionally absorbed radiation into electrical power might gradually decrease as the thickness is increased beyond its optimal subcell thickness, the external quantum efficiency of the subcell would still increase until a certain thickness is reached where no further increase in absorption could produce an increase in external quantum efficiency. Since the internal quantum efficiency of the subcell tends to drop rather sharply as the thickness of the photoconductive layers increases much beyond the diffusion length of the photogenerated excitons, the maximum external quantum efficiency of the subcell may be achieved well before the thickness of the thicker subcell is sufficient to absorb substantially all the incident radiation. Thus, the maximum external quantum efficiency that may be achieved using this single, thicker-cell approach is limited not only by the fact that the subcell thickness may be significantly greater than that desired for achieving the maximum internal quantum efficiency but, in addition, such thicker subcells may still not absorb all the incident radiation. Thus, due to both of these effects, the maximum external quantum efficiency of the thicker subcell would be expected to be significantly less than the maximum internal quantum efficiency that can be achieved for an optimal subcell having the optimal thickness.

A particular feature of the present invention having the stacked organic photosensitive optoelectronic device with the electrically parallel configuration is that instead of attempting to improve the external quantum efficiency by increasing the thickness of a single subcell, which sacrifices the internal quantum efficiency, subcells that have a thickness that is optimal or near optimal for achieving the maximum internal quantum efficiency may be used to fabricate a stacked structure. The total number of such optimal subcells that are included in the stacked structure may be increased so as to provide an increase in absorption of the incident radiation with the total number being limited by that which produces no further increase in the external quantum efficiency. The net result of this approach for improving the external quantum efficiency is that a stacked organic photosensitive optoelectronic device can be made to have an external quantum efficiency approaching the maximum value of the internal quantum efficiency that can be achieved for an individual optimal subcell. The improved external quantum efficiency of the stacked devices may be attributed in large part to the fact that the subcells of the stacked device may be comprised of pairs of transparent electrodes and, in some cases, also of a transparent top electrode.

Taking into account that the additional subcells of the stacked device tend to introduce additional losses, such as that due to the residual reflectivity of the transparent electrodes, the maximum external quantum efficiency that can be achieved for a fully optimized stacked device would typically be somewhat less than the internal quantum efficiency of an optimal subcell. Nevertheless, using the methods of the present invention for optimizing the external quantum efficiency of an organic photosensitive optoelectronic device, substantially higher external quantum efficiencies may be achieved for a stacked device than are possible for a device having a single cell, which is optimized for external quantum efficiency at the expense of internal quantum efficiency.

Since the organic photosensitive optoelectronic devices of the present invention may be desired for widely varying ambient radiation conditions, for example, with respect to the intensity of incident radiation and/or with respect to the spectral distribution of the incident radiation, the photoconductive organic materials, and the layer thicknesses thereof, may be selected so as to be optimized for a given set of ambient conditions. For example, the photoconductive organic materials may be selected to have absorption maxima in selected spectral regions. Since the photoconductive organic materials that may be used in a photosensitive optoelectronic cell may typically have absorption maxima only over a limited spectral range, it is an additional feature of the present invention that the stacked photosensitive optoelectronic devices may be comprised of different types of cells having photoconductive organic materials with different absorption characteristics so as to more effectively utilize the entire spectral range of the incident radiation.

When the term "subcell" is used hereafter, it may refer to a organic photosensitive optoelectronic construction of the unilayer, bilayer or multilayer type. When a subcell is used individually as a photosensitive optoelectronic device, it typically includes a complete set of electrodes, i.e., positive and negative. As disclosed herein, in some stacked configurations it is possible for adjacent subcells to utilize common, i.e., shared, electrode or charge transfer layers. In other cases, adjacent subcells do not share common electrodes or charge transfer layers. The term "subcell" is disclosed herein to encompass the subunit construction regardless of whether each subunit has its own distinct electrodes or shares electrodes or charge transfer layers with adjacent subunits. Herein the terms "cell", "subcell", "unit", "subunit", "section", and "subsection" are used interchangeably to refer to photoconductive layer or set of layers and the adjoining electrodes or charge transfer layers. As used herein, the terms "stack", "stacked", "multisection" and "multicell" refer to any optoelectronic device with multiple layers of a photoconductive material separated by one or more electrode or charge transfer layers.

Since the stacked subcells of the solar cell may be fabricated using vacuum deposition techniques that allow external electrical connections to be made to the electrodes separating the subcells, each of the subcells in the device may be electrically connected either in parallel or in series, depending on whether the power and/or voltage generated by the solar cell is to be maximized. The improved external quantum efficiency that may be achieved for the stacked solar cells of the present invention may also be attributed to the fact that the subcells of the stacked solar cell may be electrically connected in parallel since a parallel electrical configuration permits substantially higher fill factors to be realized than when the subcells are connected in series. It is believed that this parallel electrical configuration of the stacked subcells is a further unique aspect of the present invention.

Although the high series resistance of photoconductive organic materials inhibits use of subcells in a series configuration for high power applications, there are certain applications, for example, in operating liquid crystal displays (LCD), for which a higher voltage may be required, but only at low current and, thus, at low power levels. For this type of application, stacked, series-connected solar cells may be suitable for providing the required voltage to the LCD. In the case when the solar cell is comprised of subcells electrically connected in series so as to produce such a higher voltage device, the stacked solar cell may be fabricated so as to have each subcell producing approximately the same current so as to reduce inefficiency. For example, if the incident radiation passes through in only one direction, the stacked subcells may have an increasing thickness with the outermost subcell, which is most directly exposed to the incident radiation, being the thinnest. Alternatively, if the subcells are superposed on a reflective surface, the thicknesses of the individual subcells may be adjusted to account for the total combined radiation admitted to each subcell from the original and reflected directions.

Further, it may be desirable to have a direct current power supply capable of producing a number of different voltages. For this application, external connections to intervening electrodes could have great utility and are not believed to have been previously disclosed. Accordingly, in addition to being capable of providing the maximum voltage that is generated across the entire set of subcells, the stacked solar cells of the present invention may also be used to provide multiple voltages from a single power source by tapping a selected voltage from a selected subset of subcells.

The present invention may be further described as being directed toward a method of fabricating photosensitive optoelectronic devices comprising fabricating a first photosensitive optoelectronic subcell on a substrate so as to form a photosensitive optoelectronic cell capable of producing a given external quantum efficiency, and fabricating a second photosensitive optoelectronic subcell in superposed relationship upon the top surface of the first photosensitive optoelectronic subcell so as to form a stacked photosensitive optoelectronic device so as to increase the external quantum efficiency capability of the photosensitive optoelectronic cell, wherein at least one of the subcells of the stacked photosensitive optoelectronic cell is comprised of a pair of transparent electrodes.

The present invention may be further described as being directed toward a method of fabricating a series stacked organic photosensitive optoelectronic device comprising fabricating a first organic photosensitive optoelectronic subcell on a substrate so as to form an organic photosensitive optoelectronic device capable of producing a given voltage, and fabricating a second organic photosensitive optoelectronic subcell in superposed relationship upon the top surface of the first organic photosensitive optoelectronic subcell so as to form a stacked organic photosensitive optoelectronic device and so as to increase the voltage capability of the organic photosensitive optoelectronic device, wherein the subcells of the stacked organic photosensitive optoelectronic cell are comprised of a pair of transparent electrode layers and the first subcell and the second subcell are electrically connected in series.

The present invention may be further described as being directed toward a method of fabricating a parallel stacked organic photosensitive optoelectronic device comprising fabricating a first organic photosensitive optoelectronic subcell on a substrate so as to form an organic photosensitive optoelectronic device capable of producing a given external quantum efficiency, and fabricating a second organic photosensitive optoelectronic subcell in superposed relationship upon the top surface of the first organic photosensitive optoelectronic subcell so as to form a stacked organic photosensitive optoelectronic device so that the external quantum efficiency capability of the organic photosensitive optoelectronic device is increased, wherein the first subcell and the second subcell are electrically connected in parallel.

The present invention may be further described as being directed toward a mixed electrical configuration stacked organic photosensitive optoelectronic device comprising a substrate having a proximal surface and a distal surface, and a plurality of subassemblies of organic photosensitive optoelectronic subcells, each of the subcells having a cathode and an anode, each of the cathode and anode being an electrode layer or a charge transfer layer, the subcells in superposed relation with each other and with the distal surface of the substrate, each of the subassemblies of subcells comprising a plurality of subcells electrically connected in parallel or a plurality of subcells electrically connected in series, wherein the subassemblies are electrically connected to each other in series or in parallel such that the device includes subcells electrically arranged in series and parallel, so that the device is capable of producing a voltage higher than possible with a completely parallel arrangement with the same materials and with higher external quantum efficiency than a completely series arrangement for producing the same voltage.

The present invention may be further described as being directed toward a method of fabricating a mixed electrical configuration stacked organic photosensitive optoelectronic device comprising: fabricating a first organic photosensitive optoelectronic subcell on a substrate so as to form an organic photosensitive optoelectronic device; fabricating a second organic photosensitive optoelectronic subcell in superposed relationship upon the top surface of the first organic photosensitive optoelectronic subcell so as to form a first stacked organic photosensitive optoelectronic subassembly comprised of the first subcell and the second subcell electrically connected in series; fabricating a third organic photosensitive optoelectronic subcell in superposed relationship upon the top surface of the second organic photosensitive optoelectronic subcell; and fabricating a fourth organic photosensitive optoelectronic subcell in superposed relationship upon the top surface of the third organic photosensitive optoelectronic subcell so as to form a second stacked organic photosensitive optoelectronic subassembly comprising the third subcell and the fourth subcell electrically connected in series, wherein the first stacked organic photosensitive optoelectronic subassembly and the second stacked organic photosensitive optoelectronic subassembly are electrically connected in parallel.

Representative embodiments may also comprise transparent charge transfer layers. As described herein charge transfer layers are distinguished from ETL and HTL layers by the fact that charge transfer layers are frequently, but not necessarily, inorganic and they are generally chosen not to be photoconductively active. That is, the electrodes and charge transfer layers preferably do not absorb electromagnetic radiation for conversion to electrical or thermal forms of energy. Therefore, transparent low reflectivity electrodes and charge transfer layers are generally preferred in the present invention. In addition, the electrode and charge transfer layer electronic properties are important. In certain device configurations one or more of the electrodes or charge transfer layers may be electronically active. For example, as discussed above, an electrode or charge transfer layer may provide an interfacial region for dissociating or recombining excitons, or it may provide a rectifying interface. In other device configurations, it is desired that the electrode or charge transfer layer have minimal electronic activity and instead serve primarily as a low resistance means for delivering the photogenerated current to the external circuitry or to the adjacent subsection of a multi-section device. Moreover, in PV devices, high contact or charge transfer layer resistance is detrimental in many applications since the resulting increased series resistance limits power output.

The preferred embodiments of the present invention include, as one or more of the transparent electrodes of the optoelectronic device, a highly transparent, non-metallic, low resistance cathode such as disclosed in Parthasarathy Appl. '707 or a highly efficient, low resistance metallic/non-metallic composite cathode such as disclosed in Forrest '436. Each type of cathode is preferably prepared in a fabrication process that includes the step of sputter depositing an ITO layer onto either an organic material, such as copper phthalocyanine (CuPc), PTCDA and PTCBI, to form a highly transparent, non-metallic, low resistance cathode or onto a thin Mg:Ag layer to form a highly efficient, low resistance metallic/non-metallic composite cathode. Parthasarathy Appl. '707 discloses that an ITO layer onto which an organic layer had been deposited, instead of an organic layer onto which the ITO layer had been deposited, does not function as an efficient cathode.

In summary, it is an object of the present invention to provide an organic photosensitive optoelectronic device with two transparent electrodes.

More specifically, it is an object of the present invention to provide a stacked solar cell comprised of one or more subcells comprised of two transparent electrodes.

It is another object of the present invention to provide a stacked solar cell capable of operating with a high external quantum efficiency.

It is a still more specific object of the present invention to provide a stacked solar cell capable of operating with an external quantum efficiency that approaches the maximum internal quantum efficiency of an optimal PV subcell.

It is yet another object of the present invention to provide a stacked solar cell capable of operating with a higher voltage than can be provided by a single subcell.

Another object of the present invention is to provide an organic photosensitive optoelectronic device including multiple quantum well structures.

A further object of the present invention is to provide a stacked organic photosensitive optoelectronic device comprised of multiple organic photosensitive optoelectronic subcells with the subcells having external electrical connections.

Another object of the present invention is to provide an organic photosensitive optoelectronic device with improved absorption of incident radiation for more efficient photogeneration of charge carriers.

It is a further objective of the present invention to provide an organic photosensitive optoelectronic device with an improved $V_{OC}$ and an improved $I_{SC}$.

Another object of the present invention is to provide a stacked organic photosensitive optoelectronic device having parallel electrical interconnection of the subcells.

A further object of the present invention is to provide a stacked organic photosensitive optoelectronic device comprised of multiple organic photovoltaic subcells with transparent electrodes and having a substantially reflective bottom layer to increase overall electromagnetic radiation absorption by capturing the electromagnetic radiation reflected by the bottom layer.

Yet another object of the present invention is to provide organic photosensitive optoelectronic devices including a conductive or an insulating substrate.

A further object of the present invention is to provide organic photosensitive optoelectronic devices including a rigid or a flexible substrate.

A further object of the present invention is to provide organic photosensitive optoelectronic wherein the organic materials used are polymeric or non-polymeric thin films.

BRIEF DESCRIPTION OF THE DRAWINGS

The foregoing and other features of the present invention will be more readily apparent from the following detailed description of exemplary embodiments taken in conjunction with the attached drawings. It will be noted that for convenience all illustrations of devices show the height dimension exaggerated in relation to the width.

DETAILED DESCRIPTION

Figure 1:
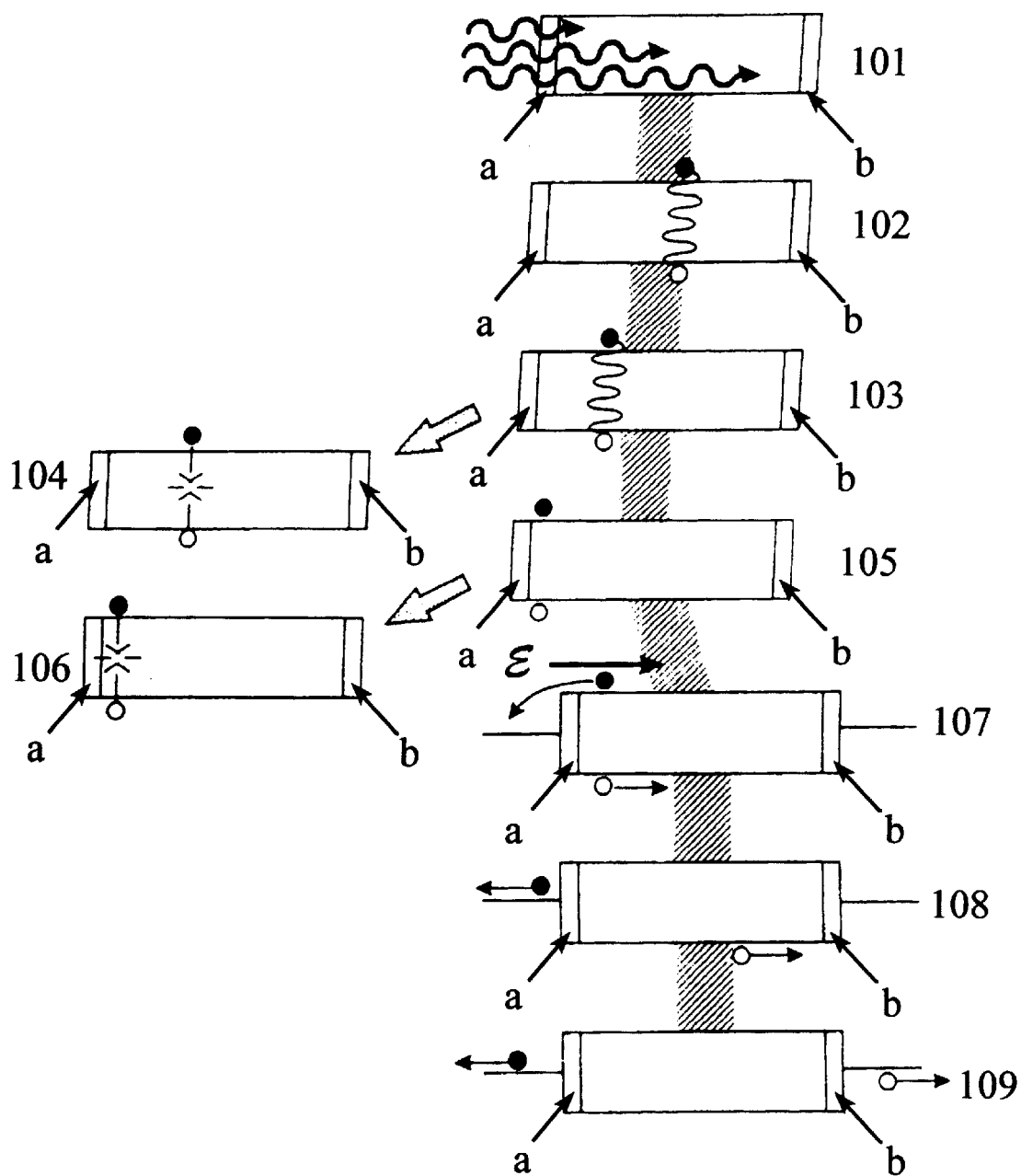
FIG. 1 illustrates a simple prior art model of photoconductivity in organic materials.
Figure 2A:
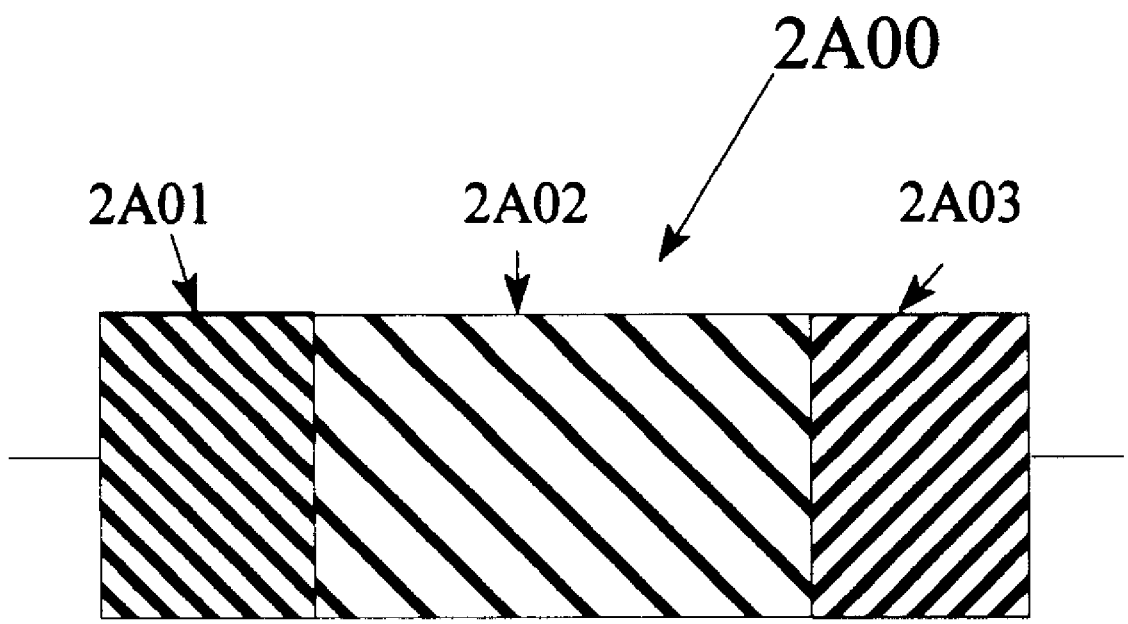
FIGS. 2A, 2B, 2C and 2D schematically depict prior art organic photovoltaic devices.
Figure 2B:
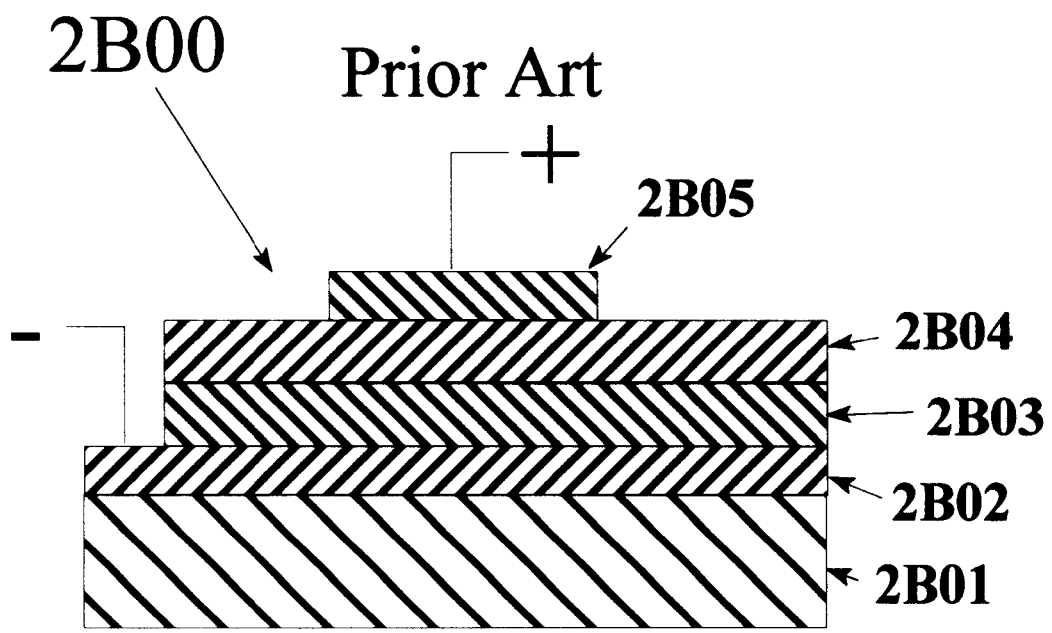
Figure 2C:
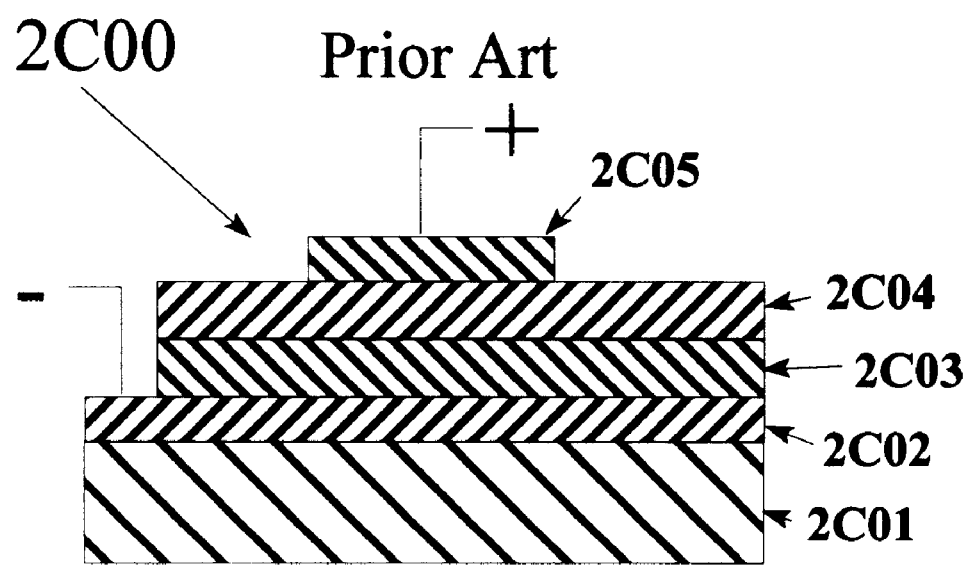
Figure 2D:
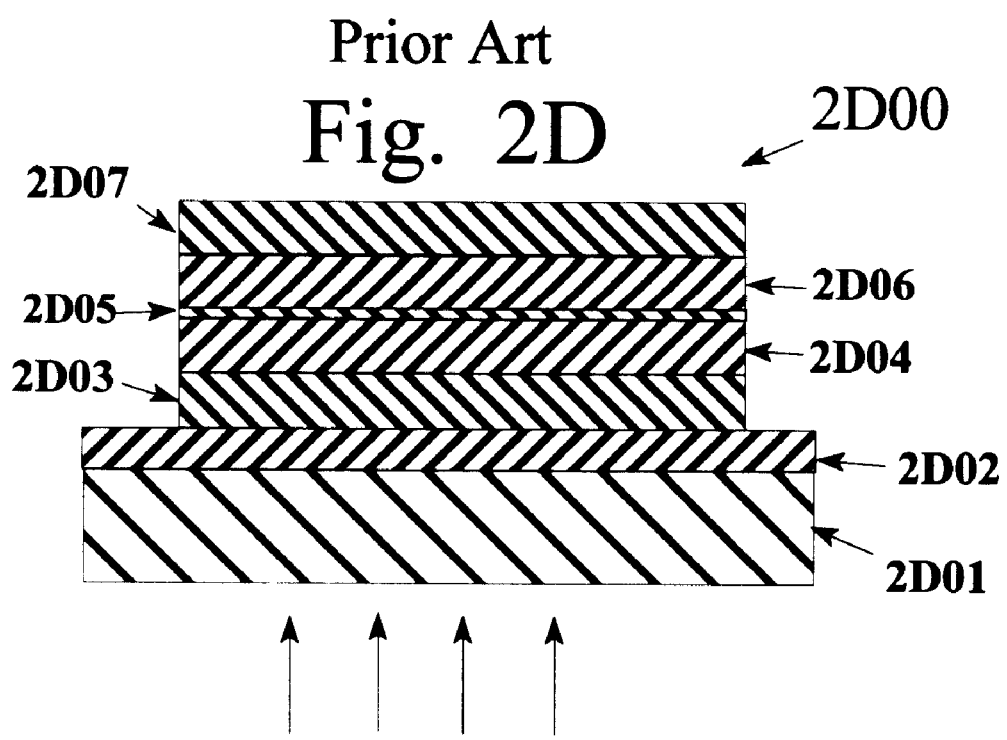
Figure 3:
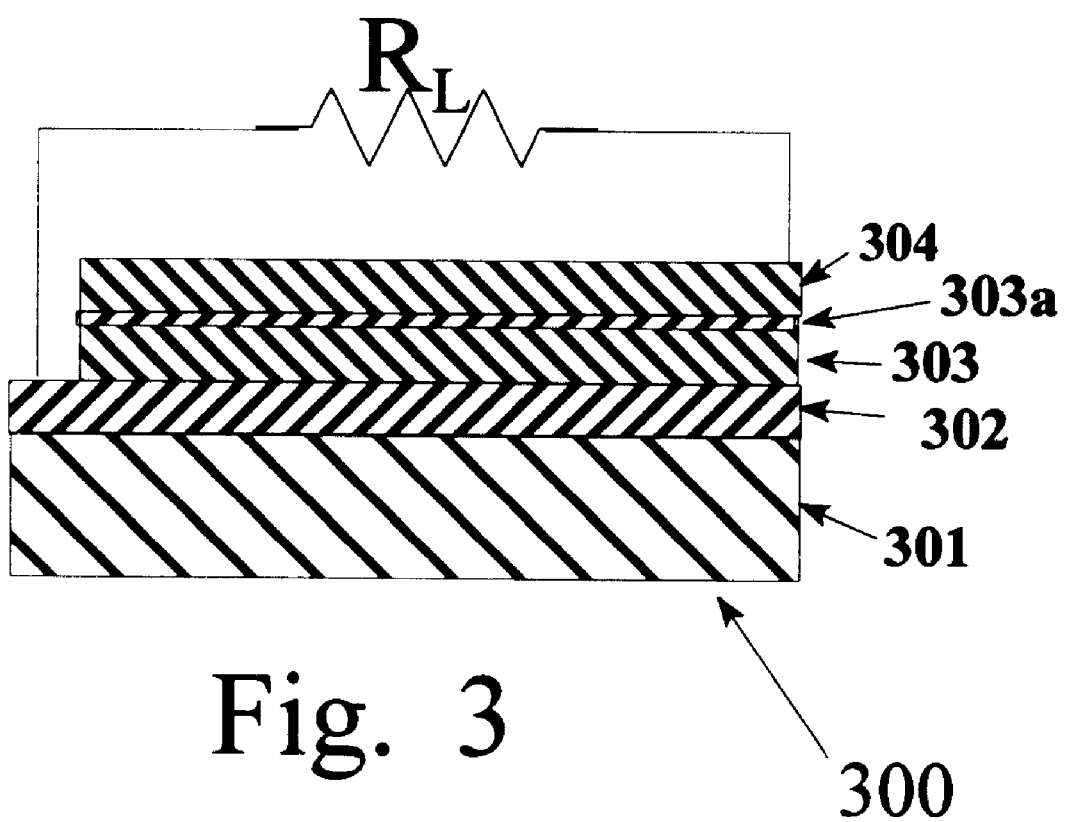
FIG. 3 schematically depicts an organic photosensitive optoelectronic device with transparent non-metallic electrodes and a single organic layer.

In an exemplary embodiment of the present invention, as shown in FIG. 3, the device structure 300 is deposited onto an insulating substrate 301. First electrode 302 is transparent and comprises, e.g., ITO deposited by conventional techniques or available predeposited on commercial substrates to an approximate thickness of 1000–4000 Å, preferably less than 2000 Å and most preferably around 1000 Å. Layer 303 is a single organic photoconductor, e.g., CuPc or PTCDA, or PTCBI deposited by organic molecular beam deposition (OMBD) in a layer of thickness 300–1000 Å, preferably about 500 Å. Second electrode 304 is transparent, e.g., ITO deposited by sputtering to an approximate thickness of 1000–4000 Å, preferably less than 2000 Å and most preferably around 1000 Å. An understanding from the prior art would indicate that such a symmetric unilayer device configuration would not generate a net photocurrent. However, the necessary asymmetry is believed to arise at the interface between organic photoconductor layer 303 and second electrode 304 from electronic surface states in organic photoconductor layer 303 produced during the deposition of ITO second electrode 304. The damage region is schematically represented as region 303a. The exact mechanism by which the altered region at the interface produces asymmetric charge separating regions is not completely understood. Without limiting the present invention to a particular theory, the effect of energetic electrode deposition, such as sputtering, may be sufficient to alter the energy states at the interface so significantly that the conventional picture of opposing mirror-image Schottky barriers is altered. Parthasarathy Appl. '707 discloses that the surface states, which may be defects, may effectively provide small energy "steps" that allow electrons to more easily traverse what would otherwise be, for example, a Schottky barrier. One theory of unilayer device operation is that deposition of electrode 304 onto organic layer 303 creates a low resistance contact, here a cathode. It is believed in this case that the resulting asymmetry would yield a net photocurrent.

Figure 4A:
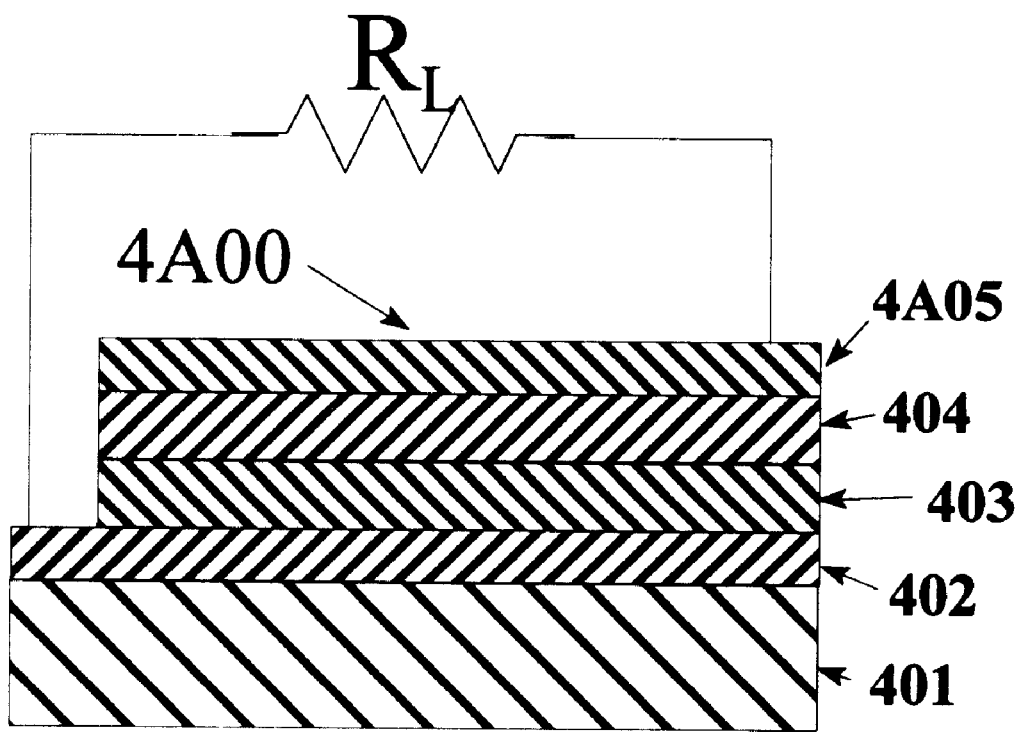
FIGS. 4A and 4B schematically depict organic photosensitive optoelectronic device with transparent electrodes and two organic layers.
Figure 4B:
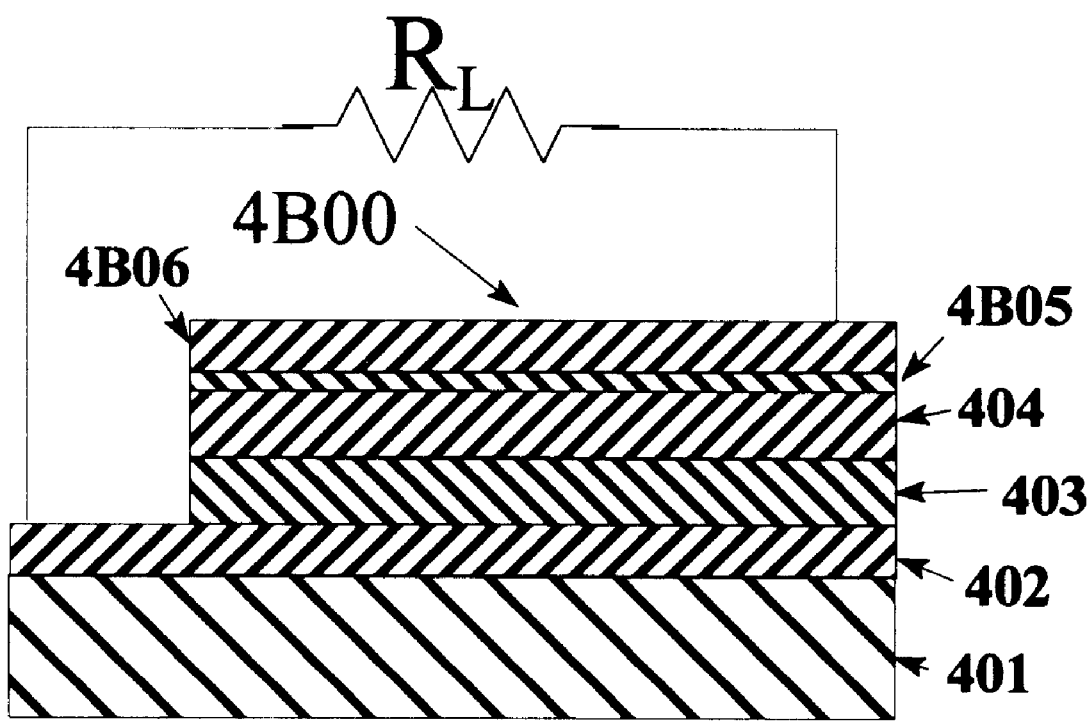

Exemplary embodiments of an organic photosensitive optoelectronic device with two organic layers, or a bilayer device 400, are depicted in FIGS. 4A and 4B. The substrate 401 provides support for first electrode 402 which comprises ITO of approximate thickness 1000–4000 Å, preferably less than 2000 Å and most preferably around 1000 Å. First organic layer 403 is adjacent to first electrode 402 and comprises, e.g., PTCDA or PTCBI. Second organic layer 404 comprising, e.g., CuPc, is adjacent to first organic layer 403 to form the photovoltaic heterojunction. Finally, in 4A00 in FIG. 4A, second electrode 4A05 comprises ITO of approximate thickness of 1000–4000 A, preferably less than 2000 Å and most preferably around 1000 Å and is deposited onto second organic layer 404. In the alternate embodiment 4B00 in FIG. 4B, the second electrode is a metallic/non-metallic composite electrode comprised of semitransparent metallic layer 4B05 which is topped by an ITO layer 4B06. Semitransparent metallic layer 4B05 may preferably consist of 10% Ag in 90% Mg, or other low work function metals or metal alloys. Layer 4B05 is thin, preferably less than 100 Å thick. ITO layer 4B06 is about 1000–4000 Å thick and is preferably less than 2000 Å and most preferably approximately 1000 Å thick. Both organic layers are approximately 300–1000 Å thick and are preferably about 500 Å thick. The junction formed at the first organic layer 403/second organic layer 404 interface is such that under electromagnetic radiation, excitons formed in the vicinity of the interface are dissociated to form free electron-hole pairs. Photogenerated holes are collected at first electrode 402 and photogenerated electrons are collected at second electrode 405.

Embodiment 4A00 incorporates the low resistance metal substitute cathode disclosed in Parthasarathy Appl. '707. It should be observed that in contrast to the OLEDs of Parthasarathy Appl. '707 wherein the electrons move from the cathode into the adjacent organic semiconductor, organic photosensitive optoelectronic bilayer device 400 represents an embodiment of a photosensitive optoelectronic device. Accordingly, the thicknesses of the photoconductive organic materials are adjusted to the requirements of a photosensitive optoelectronic device, and during operation electrons flow from second organic layer 404 into second electrode 4A05. Without being limited to this particular theory, it was typically believed by one skilled in the art that metal substitute electrodes, e.g., ITO, would create a barrier to electron flow in both directions, i.e., into or out of the device, when such materials were used as cathodes. The low resistance operation of the ITO cathode in the present invention demonstrates that the surface states proposed in Parthasarathy Appl. '707 are effective in reducing the barrier to electron flow in either direction at an ITO cathode made in accord with the present invention of Parthasarathy Appl. '707. Although first organic layer 403 and second organic layer 404 may be interchanged in some cases and still obtain a working device with only a reversal of polarity, these embodiments are less preferred due to the reduced efficiency of a device whenever the metal substitute electrode is used as the bottom cathode. The surface states believed to effectively reduce the barrier at an ITO cathode are not thought to be produced when the organic thin film is deposited onto the ITO layer. The term "low resistance metal substitute cathode" is, thus, used herein to refer to a metal substitute, e.g., ITO, prepared by sputter depositing a metal substitute, e.g., ITO, onto an organic layer, in particular, as distinct from an electrode prepared by depositing an organic layer onto a metal substrate, e.g., ITO. It is believed herein that the barrier-reducing effect of surface states also can function to permit holes to traverse what would otherwise be blocking junctions at an interface between an organic semiconductor layer and an electrode or charge transfer layer.

Embodiment 4B00 utilizes a transparent metallic/non-metallic composite cathode comprised of layers 4B05 and 4B06. Here again, as an embodiment particularly suited for use as a solar cell, during operation electrons generated near the 403/404 interface move toward layer 4B05 and move through layer 4B06 for extraction. It is noted, in particular, that, whenever the ITO is sputter deposited onto a given thickness of Mg:Ag, the metallic/non-metallic composite cathode of Mg:Ag/ITO has substantially higher transparency than a noncomposite metallic layer having the same given thickness as the metallic part of the composite electrode. Further, the composite transparent composite layer may have better electronic properties than the lower resistance highly transparent non-metallic cathode. Thus, while the transmission of the metallic/non-metallic composite electrode is typically not as high the highly-transmissive low resistance metal substitute cathode, the transmission is still sufficient, in combination with the superior electronic properties, for such metallic/non-metallic cathodes to be useful in the photosensitive optoelectronic devices of the present invention.

Figure 5:
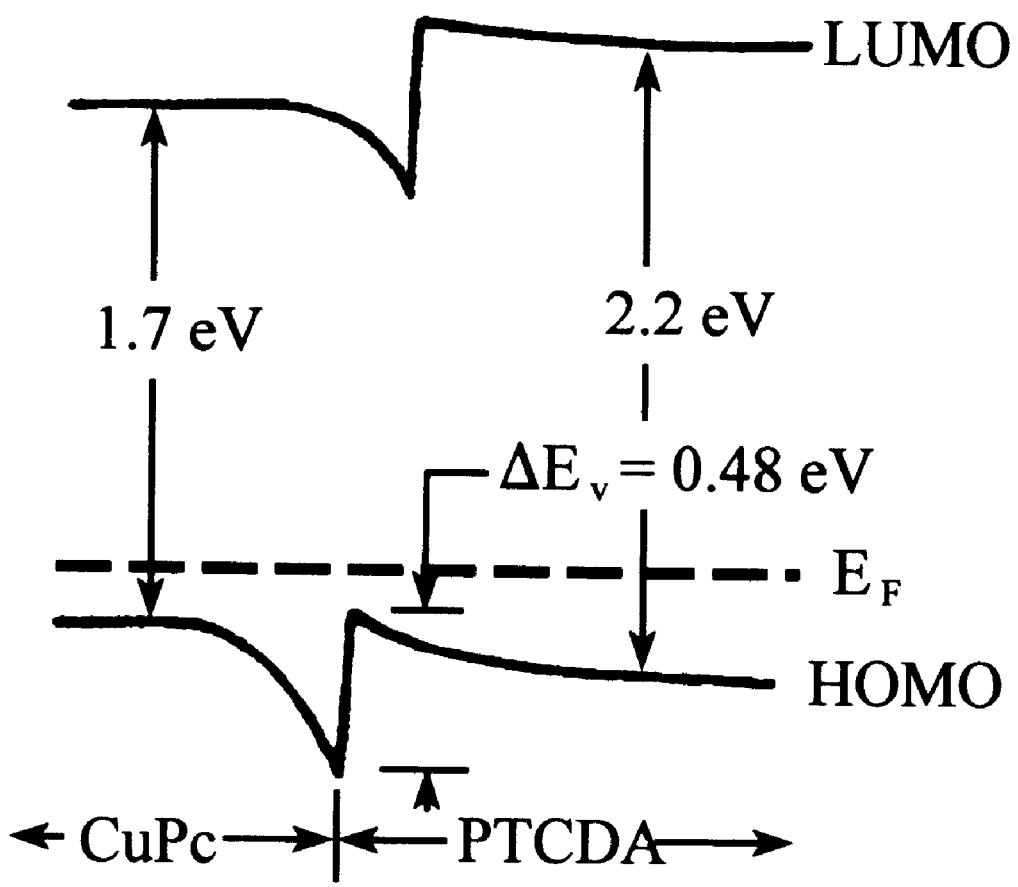
FIG. 5 illustrates the energy levels of an isotype bilayer interface.

In the bilayer cell, charge separation occurs in the vicinity of the organic heterojunction whose built-in potential is determined by the size of the HOMO—LUMO gap energy difference between the contacting materials, here first organic layer 403 and second organic layer 404. FIG. 5 depicts the relative HOMO-LUMO gaps of exemplary materials for an isotype heterojunction, e.g., CuPc/PTCDA. The proximity of the Fermi energy, $E_F$, to the HOMO band shows that all of these materials have holes as the majority carrier. The HOMO offset is equal to the difference of ionization potentials (IP) of the two contacting materials and the LUMO offset is equal to the HOMO offset plus the difference in HOMO—LUMO gap energies ($E_{H-L}$) of the two materials. The polarity of the device is generally determined by the HOMO-LUMO energy differences. For example, in FIG. 5 since the LUMO of the PTCDA first organic layer 403 is higher in energy than that in the CuPc second organic layer 404, electrons that are liberated from an exciton will move from the PTCDA 403 into the CuPc 404 and contribute to the photocurrent. Absorption can occur in either of the two organic films, thereby extending the width of the photoactive region where optical absorption can result in efficient charge separation by the built-in field. Note that it is not critical whether a "p-n"-like junction or a simple isotype (i.e., p-P or n-N) heterojunction is employed, since it is only the diffusion potential created at the heterojunction due to the HOMO—LUMO gap offsets that is effective in carrier drift.

In the bilayer cells any rectifying effect of the organic material/electrode junction is much less significant than that occurring at the bilayer heterojunction. Further, since the damage layer which occurs when, e.g., ITO, is deposited over an organic material is significant in causing exciton ionization, this damage may be controlled using the low power sputtering technique described in Parthasarathy Appl. '863. It is believed that controlling this damage region will insure that exciton ionization and carrier separation primarily occurs at the organic/organic bilayer heterojunction.

Figure 6:
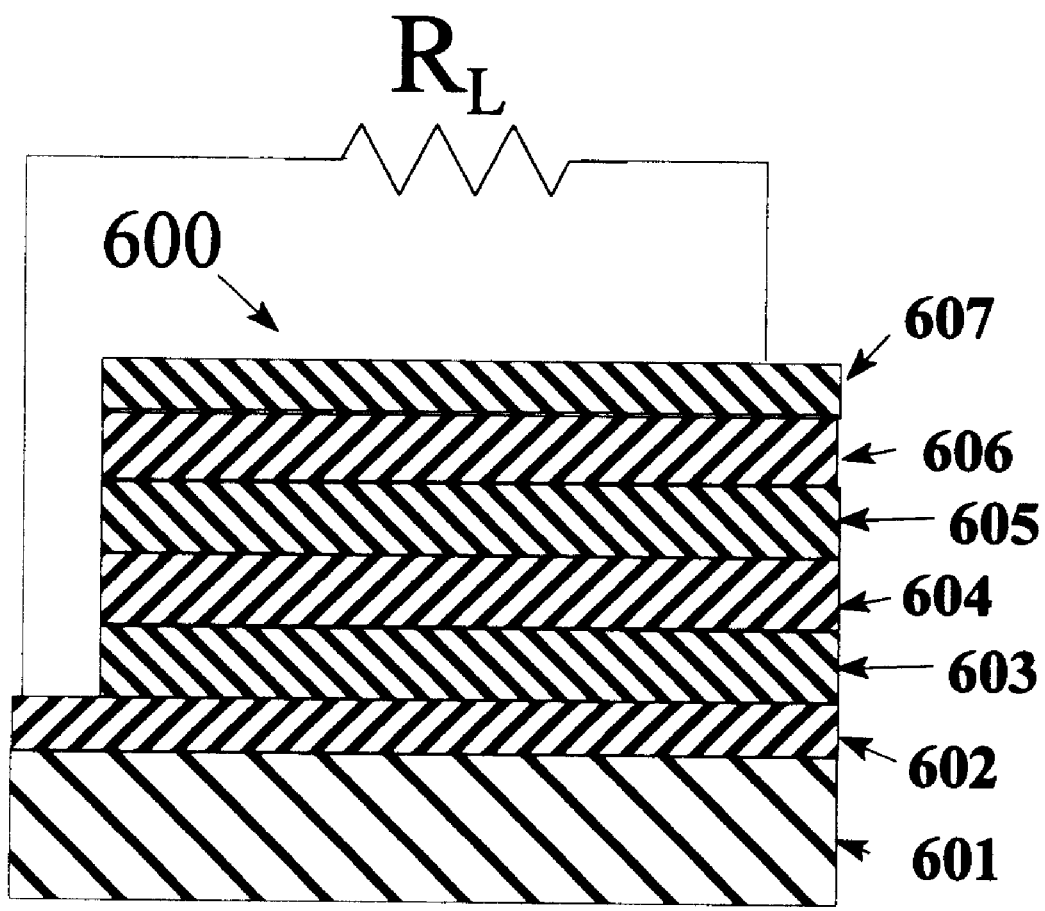
FIG. 6 schematically depicts an organic photosensitive optoelectronic device with transparent non-metallic electrodes and more than two organic layers.

An exemplary embodiment of a organic photosensitive optoelectronic cell with multiple organic layers, or a multilayer device 600, is shown in FIG. 6. Insulating or conducting substrate 601 supports the device. First electrode 602 comprises, e.g., ITO of approximate thickness 1000–4000 Å, preferably less than 2000 Å and most preferably around 1000 Å and is adjacent to first organic layer 603 comprising, e.g., PTCDA, PTCBI, or CuPc of approximate thickness 20–50 Å. A second organic layer 604 comprises, e.g., 4,4'-bis [N-(1-napthyl)-N-phenyl-amino]biphenyl (α-NPD), approximately 200–500 Å in thickness, and is adjacent to first organic layer 603. A third organic layer 605, comprising, e.g., aluminum tris(8-hydroxyquinoline) (Alq$_3$), approximately 200–500 Å in thickness, is adjacent to second organic layer 604 to form a rectifying heterojunction at the second organic layer 604/third organic layer 605 interface. A fourth organic layer 606, comprising, e.g., CuPc, PTCBI, or PTCDA, of approximate thickness 20–50 Å is adjacent to third organic layer 605. Finally, second transparent electrode 607 is adjacent to the fourth organic layer 606 and comprises, e.g., ITO of approximate thickness 1000–4000 Å, preferably less than 2000 Å and most preferably around 1000 Å. In this embodiment, an extra pair of organic materials, here second organic layer 604 and third organic layer 605, selected to have appropriate relative mobilities and HOMO-LUMO offset for exciton ionization and charge separation is placed within a "sandwich" of two other organic materials, here first organic layer 602 and fourth organic layer 606. In this instance, the "inner" pair of organic materials, 604 and 605, provides the exciton ionization and charge separation and the "outer" pair, 603 and 606, serves both as charge transporting layers, i.e., transporting the separated carriers to the proper electrodes for substantially ohmic extraction, and as protective cap layers, i.e., protecting the inner pair of organic layers from damage during deposition and use. The outer pair of organic materials may be from the group consisting of CuPc, PTCDA, and PTCBI, or any two of the three may be used. That is, the same material or any combination thereof may be used for both contacts. Note, however, in embodiment 600, the interior pair of layers, 604 and 605, are preferably deposited so that the cathode side is on top so as to incorporate a low resistance cathode. However, as with the exemplary embodiment of FIG. 4A, the order of the deposition of the inner pair of organic materials is not critical electronically, though the order of the inner pair determines the polarity of the photosensitive optoelectronic device Since the outer pair of organic layers is relatively thin, their electronic properties are of much less significance here than in the bilayer exemplary embodiment described herein above wherein the CuPc, PTCDA, and PTCBI also performed photoconversion and exciton ionization in addition to transporting the separated carriers. Accordingly, an alternate embodiment of the present invention (not depicted) in a multilayer device would include the cathode on the bottom. The inner pair of organic materials may each be an organic dye chosen to have photosensitivity in a desired region of the spectrum. Since the $Alq_3/\alpha$-NPD pair is photosensitive in the ultraviolet (UV) part of the spectrum, multilayer device 600 with this organic pair combination is a particular exemplary embodiment of a UV photodetector. Further, the dye pair is preferably chosen to have a LUMO-HOMO gap offset as described above. In yet another embodiment (not shown) one or both of the outer pair of organic layers is replaced with a thin layer, approximately 50–150 Å of Mg:Ag alloy which acts as a charge transfer, extraction, and protective cap layer.

Figure 7:
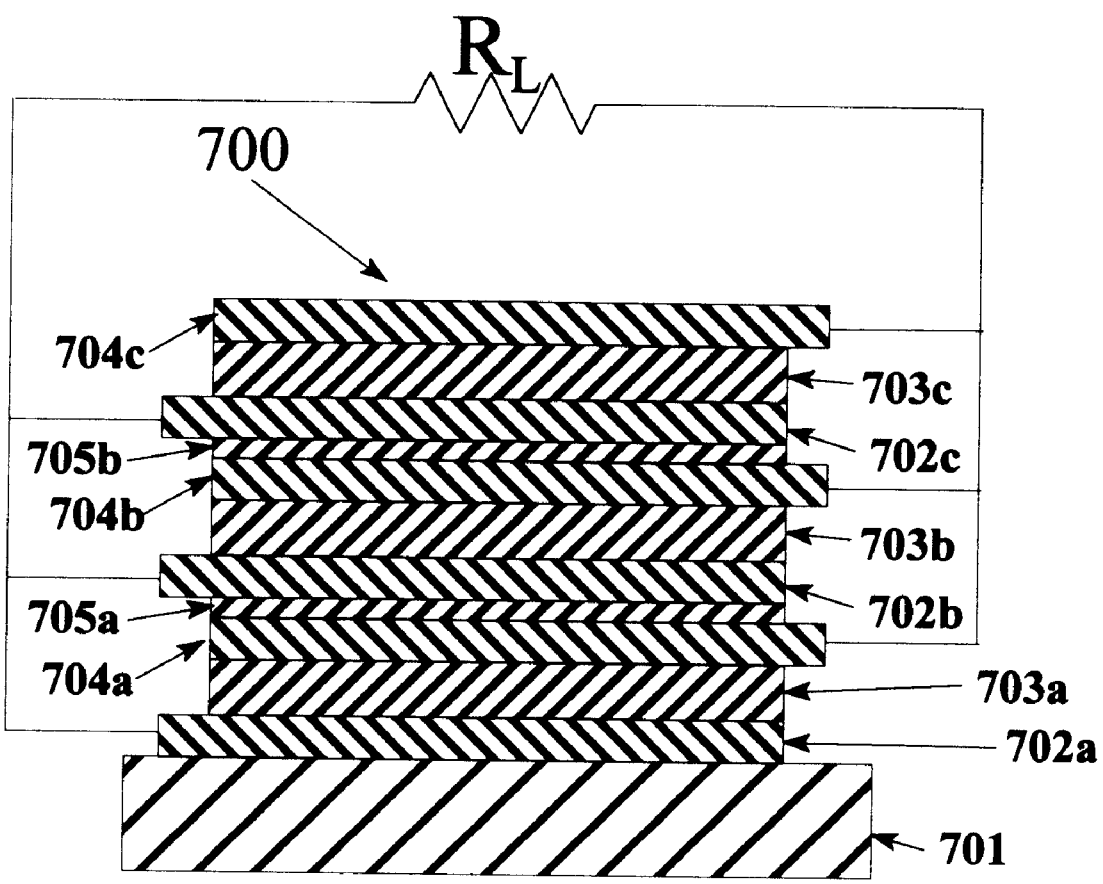
FIG. 7 schematically depicts a stacked organic photosensitive optoelectronic device arrangement where each subunit has one organic layer.

A further exemplary embodiment of the present invention is shown in FIG. 7, which depicts a stacked single-organic-layer (unilayer) photosensitive optoelectronic arrangement 700 wherein the individual unilayer subcells are electrically connected in parallel. Insulating or conductive substrate 701 provides support for the stacked photosensitive optoelectronic device. The stack shown consists of three complete unilayer photosensitive optoelectronic subcells separated by transparent insulating layers. Specifically, each subcell has a first transparent electrode, e.g., ITO, 702a, 702b, and 702c. On top of each first ITO electrode there are organic layers 703a, 703b, and 703c. Then on top of each organic layer is a second ITO electrode 704a, 704b, 704c. Since the damage layer which produces the required device asymmetry is always developed at the interface where ITO is deposited onto an organic material, all of the devices will have the same electrical polarity with respect to the direction of material deposition. That is, the subcells are inherently deposited in an electrically series configuration. Such a series configuration may be useful in low power applications as discussed above. Also, in accord with the present invention, external connections are possible to the intervening electrodes to allow for the availability of multiple voltages from a single device comprising stacked unilayer subcells. (This embodiment is not illustrated). However, a parallel electrical arrangement is preferable for high power applications in view of the series resistance and space charge effects discussed above. This means that the subcells may not share common ITO electrodes as is possible in the bilayer stacks discussed below. Therefore, in the embodiment shown in FIG. 7, transparent insulating layers 705a and 705b are provided to separate the adjacent subcells. This allows all the first ITO electrodes, 702a, 702b, and 702c to be connected to a common electrical path. Similarly, all the second ITO electrodes 704a, 704b, and 704c are connected to a common electrical path. It can be appreciated that the stack could be continued to include a number of subcells. Stacked unilayer devices may be optimized according to the criteria disclosed herein to, e.g., maximize total voltage, quantum efficiency or power. Stacking beyond a thickness in which substantially all incident light is absorbed will not further increase conversion efficiency.

Figure 8A:
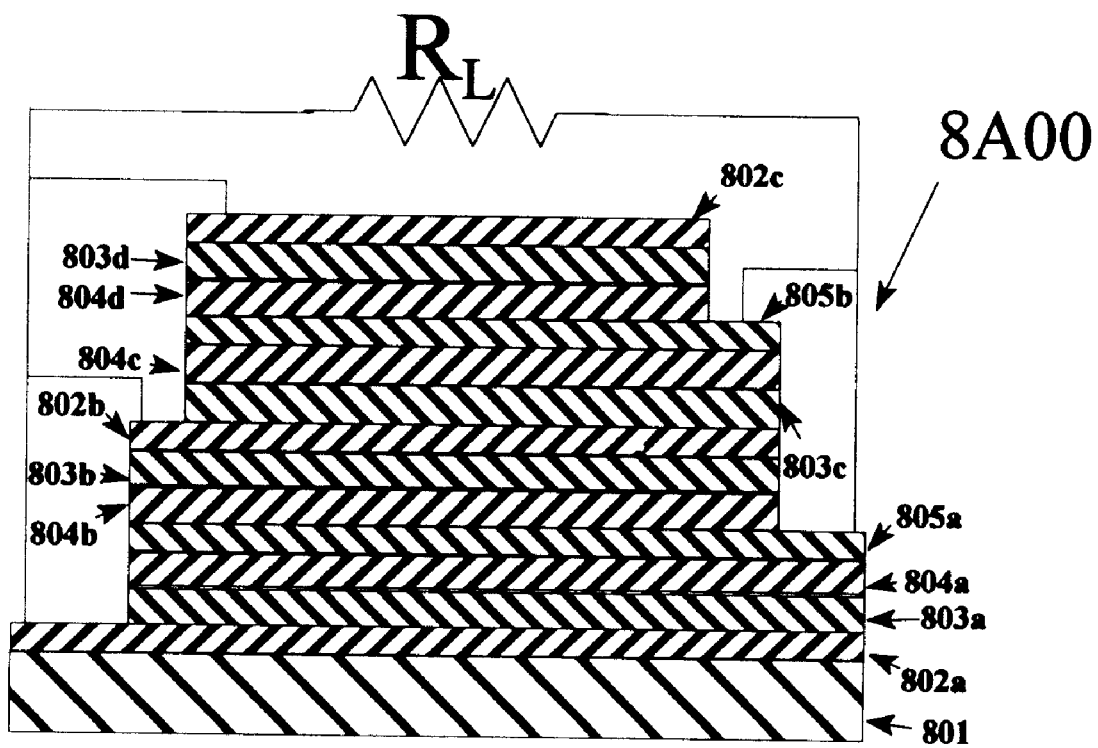
FIGS. 8A, 8B, 8C and 8D schematically depict stacked organic photosensitive optoelectronic device arrangements where each subunit has two organic layers.
Figure 8B:
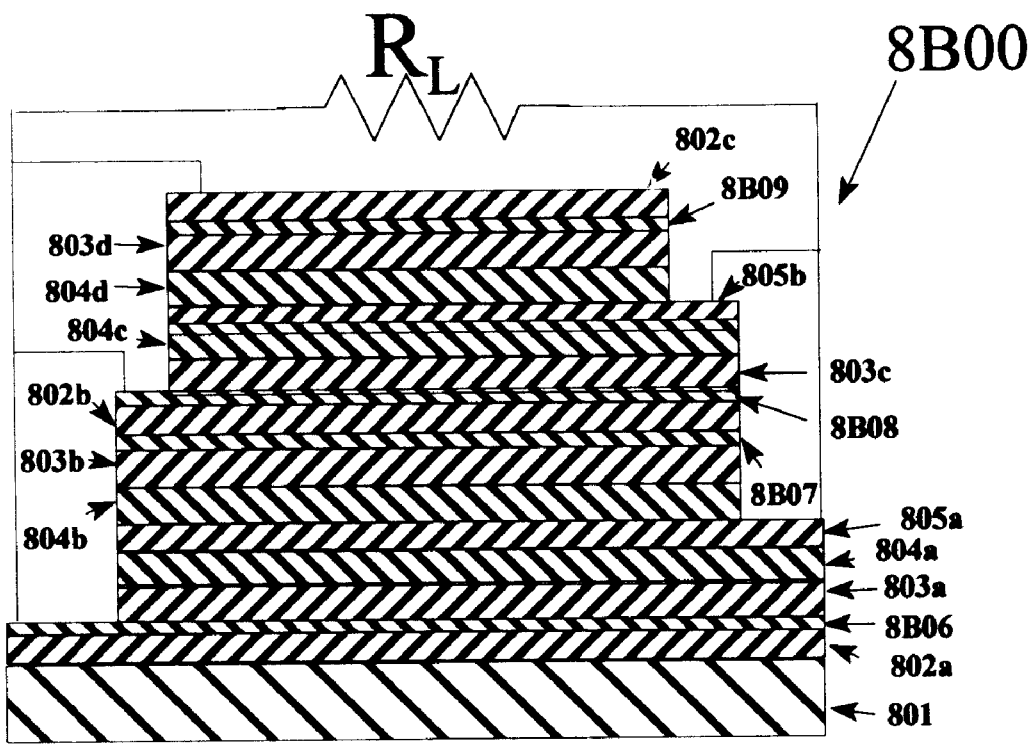

Two exemplary embodiments 8A00 and 8B00 are shown in FIGS. 8A and 8B. Embodiment 8A00 comprises several bilayer photosensitive optoelectronic devices arranged so that their polarity alternates as a function of position in the stack. Insulating or conductive substrate 801 provides support. Layers 802a, 802b, and 802c are photosensitive optoelectronic subcell first transparent electrodes comprising, e.g., ITO. They may also be some other transparent oxide or a metal. Layers 803a, 803b, 803c, and 803d are photosensitive optoelectronic subcell first organic layers comprising, e.g., CuPc. Layers 804a, 804b, 804c, and 804d are photosensitive optoelectronic subcell second organic layers comprising, e.g., PTCDA or PTCBI. Layers 805a and 805b are photosensitive optoelectronic subcell second transparent electrodes comprising, e.g., ITO. Layer thickness ranges are the same as those given for the individual bilayer subcell embodiment described with respect to FIG. 4A. Since the subcells are deposited back-to-back, all electrodes within the interior of the stack, i.e., 802b and 805a and 805b, are contacts to two different subcells and the entire stack arrangement is electrically connected in parallel. As used herein, the term "back-to-back" is used to indicate that adjacent subcells have antiparallel polarities. It can be appreciated here as well that the stack could be continued to include an arbitrary number of subcells to increase the photocurrent. However, stacking beyond a thickness in which substantially all incident light is absorbed will not further increase conversion efficiency. Also, the choice of which organic layer to deposit first is not critical though it does determine the stack ordering thereafter for a given stacked device.

In another exemplary embodiment 8B00 of a stacked device of several back-to-back subcells, electrode layers 802a, 802b and 802c are augmented as now described. In order to take advantage where possible of the beneficial effect of a thin metallic layer combined with a layer of ITO, using what is herein referred to as a metallic/non-metallic composite electrode, thin semitransparent metallic layers, e.g., Mg:Ag, are added in several places. Metallic layer 8B06 is adjacent to ITO layer 802a. Metallic layers 8B07 and 8B08 are adjacent to ITO layer 802b. Metallic layer 8B09 is adjacent to ITO layer 802c.

It is appreciated that in the electronically back-to-back configuration of stacked bilayer device 8A00, the subcell cathodes necessarily are alternately on top of the individual subcells as the stack is built from bottom up. This means that not all subcells will have what is referred to herein as the low resistance non-metallic cathode. In yet another embodiment (not shown), the subcells may be deposited with the organic layers in non-alternating order as just described but with additional transparent electrode layers and insulating layers between the individual subcells in a manner similar to that described above for the unilayer device. In this embodiment, the subcells may be connected externally in parallel and also have the cathode always on top to take advantage of the low resistance non-metallic cathode.

Figure 8C:
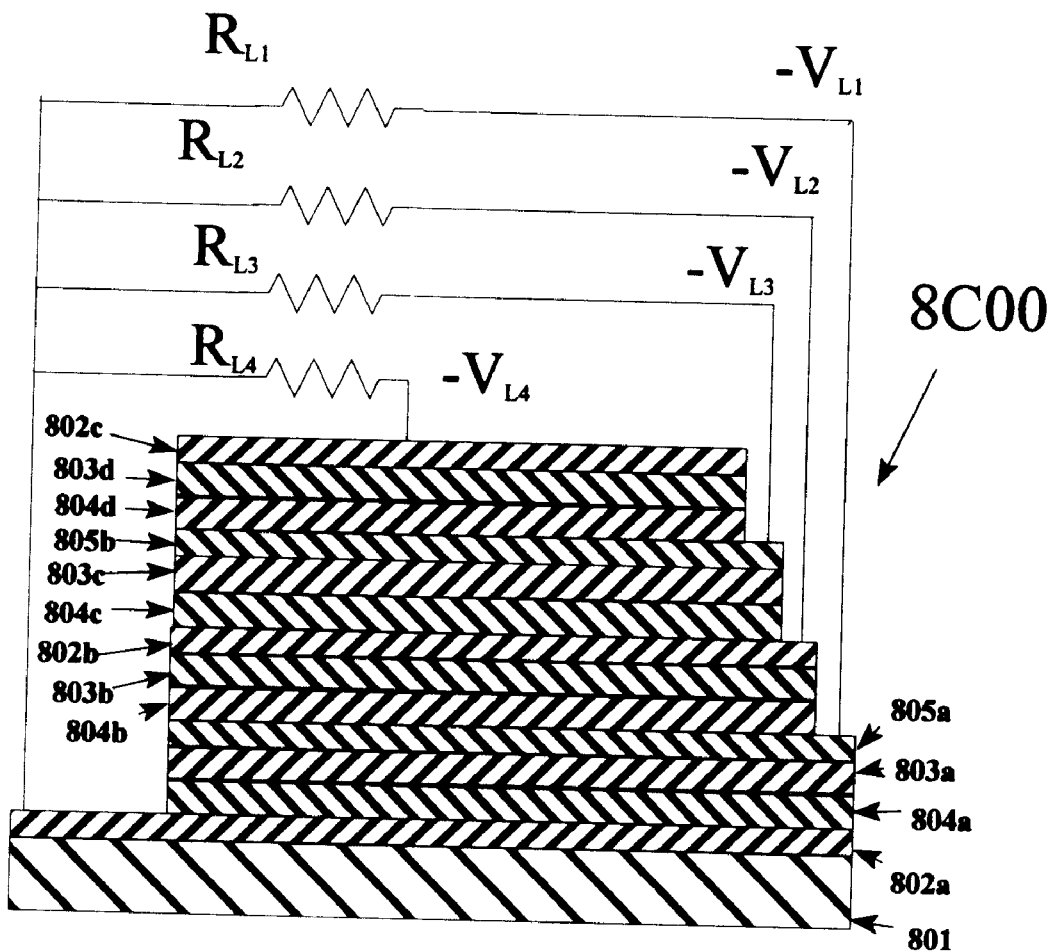
Figure 8D:
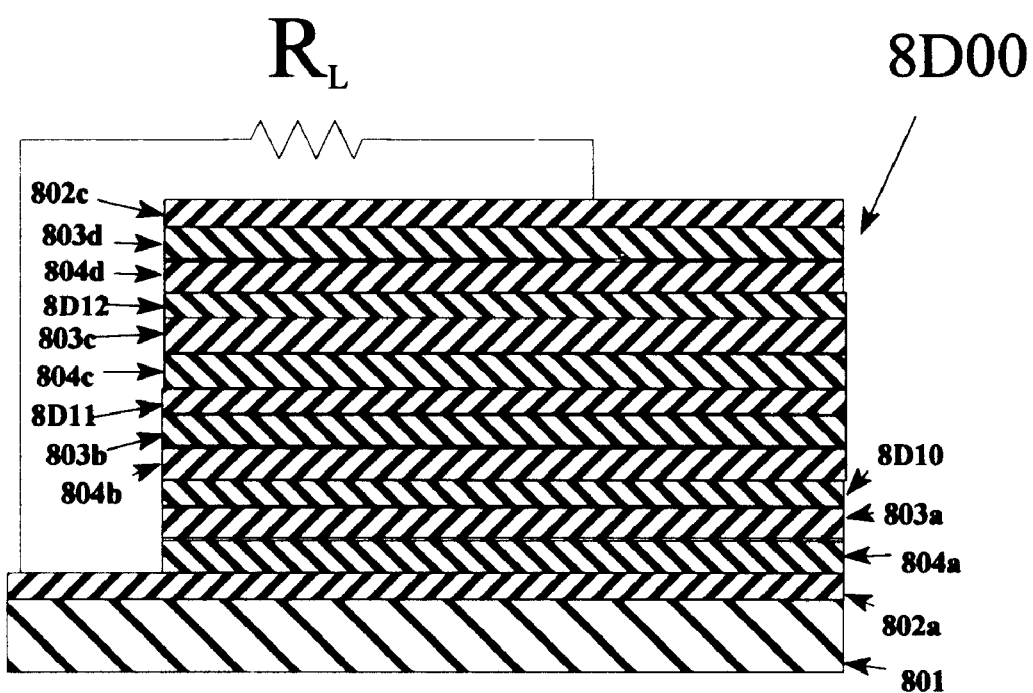

In other embodiments, a bilayer stacked device may be constructed in which the subcells are in series by not alternating the order of the two organic layers. In accord with the present invention such devices may have external connections to electrodes between subunits or may have the subunits interconnected by charge transfer layers and isolated from external circuits. FIG. 8C depicts a series connected device 8C00 with intervening electrodes. Layers 803a, 803b, 803c, 803d are arranged to be on top of layers 804a, 804b, 804c and 804d in each of their respective subcells. This means that each subcell is arranged to have an ETL, e.g., CuPc, on top of a HTL, e.g., PTCDA or PTCBI, so that each subcell has the cathode on top. This means that this embodiment is arranged to take advantage of the low resistance non-metallic cathode. Device 8C00 provides a plurality of negative voltages $V_{L1...N}$ where N is the number of subcells. N=4 is depicted in FIG. 8C. Note also that each available voltage $V_{Li}$ is the sum of the voltages from all lower numbered cells. In another embodiment (not shown) which is a variant of device 8C00, the metallic/non-metallic composite cathode is utilized by inserting thin semitransparent metallic layers of, e.g., 10% Ag in 90% Mg, or other low work function metals or metal alloys. These metallic layers of, approximately 100 Å or less in thickness, are placed below and adjacent to the metal substitute, e.g., ITO, layers 805a, 802b, 805b and 802c to form a metallic/non-metallic composite cathode for each subunit. In another embodiment (not shown) layers 804a, 804b, 804c and 804d are arranged to be on top of layers 803a, 803b, 803c, 803d so that the subunits have the anode on top and the voltages $V_{Li}$ correspondingly have the opposite polarity. FIG. 8D depicts a series connected device 8D00 similar to device 8C00 but with the subunits interconnected by charge transfer layers 8D10, 8D11 and 8D12 of, e.g, ITO of approximate thickness 1000–4000 Å, preferably less than 2000 Å and most preferably around 1000 Å. There is yet another embodiment (not shown) in which the organic semiconducting layers are reversed so that a device with an overall opposite electrical polarity is obtained. Another embodiment is a variation (not shown) of device 8D00 in which thin semitransparent metallic layers of, e.g., 10% Ag in 90% Mg, or other low work function metals or metal alloys layers of approximate thickness 100 Å or less are placed below and adjacent to layers 8D10, 8D11 and 8D12 to form metallic/non-metallic composite charge transfer layers and below and adjacent to layer 802c to form a metallic/non-metallic composite cathode.

Figure 9:
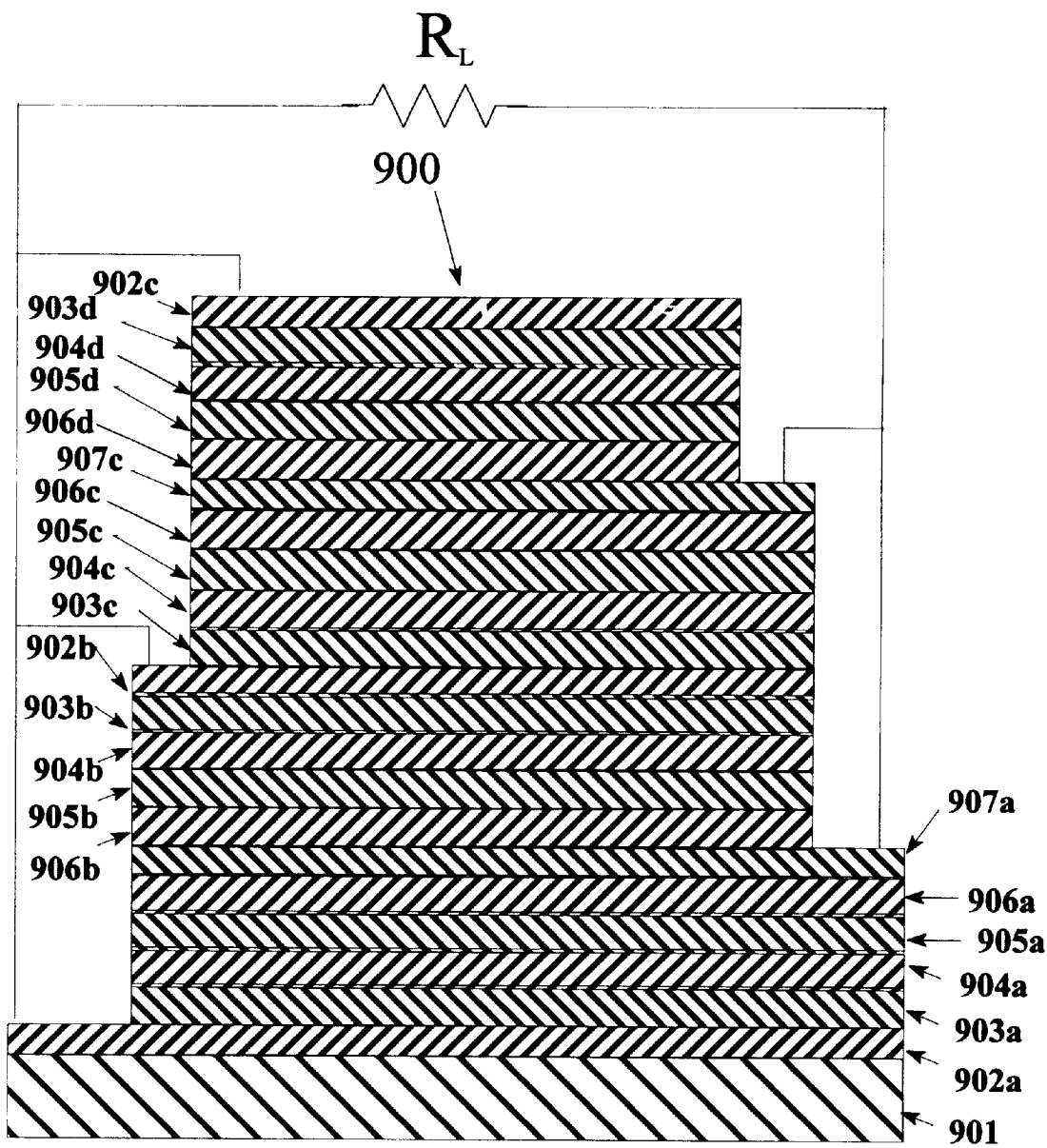
FIG. 9 schematically depicts a stacked organic photosensitive optoelectronic device arrangement where each unit has more than two organic layers.

In FIG. 9, an exemplary embodiment 900 of a stacked organic photosensitive optoelectronic device comprised of a number of multilayer organic photovoltaic subcells. Insulating or conductive substrate 901 provides support. Photovoltaic subcell first transparent electrodes 902a, 902b, and 902c comprise, e.g., ITO. Photosensitive optoelectronic subcell first organic layers 903a, 903b, 903c, and 903d comprise, e.g., CuPc or PTCDA or PTCBI. Photosensitive optoelectronic subcell second organic layers 904a, 904b, 904c, and 904d comprise, e.g., α-NPD. Photosensitive optoelectronic subcell third organic layers 905a, 905b, 905c, and 905d comprise, e.g., $Alq_3$. Photosensitive optoelectronic subcell fourth organic layers 906a, 906b, 906c, and 906d comprise, e.g., CuPc or PTCDA or PTCBI. Photosensitive optoelectronic subcell second transparent electrodes 907a and 907b comprise, e.g., ITO. Dimensions in each subcell of this exemplary embodiment are the same ranges as in the embodiment of FIG. 6 but are varied for optimization according to the criteria disclosed elsewhere herein. All first transparent electrodes 902a, 902b, and 902c are electrically connected in parallel and all second transparent electrodes are electrically connected in parallel to provide increased photocurrent. Here as well, the stack could be continued to include an arbitrary number of subcells. However, stacking beyond a thickness in which substantially all incident light is absorbed will not further increase conversion efficiency. Just as the order of the inner pairs of the subcell was not critical in the exemplary embodiment of FIG. 6, it is not critical here either except that the pair order must alternate between subcells to allow the interior transparent electrodes to act as common contacts for adjacent cells. Therefore, the order of the first inner pair of organic layers will determine the order for the remainder of the stack in this parallel interconnected embodiment.

A further embodiment of the present invention (not shown) is a variation of embodiment 900 and has the subcells separated by transparent insulating layers, such as $SiO_2$ of approximate thickness 500–4000 Å, preferably less than 3000 Å and most preferably around 2000 Å, with additional transparent electrode layers as required in analogy to the unilayer and bilayer stacked devices described above. If the $Alq_3$ and α-NPD layers are arranged with the $Alq_3$ on top then the subcells are all oriented with the cathode on top to utilize the low resistance cathode such as disclosed in Parthasarathy Appl. '707. With the subcells thus electrically isolated in the stack they may be connected externally in accord with the present invention in either a parallel or series manner as described with the bilayer subcells.

In other variations of embodiment 900, the present invention has a stacked configuration wherein the subunits are stacked in series, i.e., with aligned polarity but not separated by insulating layers. In one embodiment (not shown) the multilayer cells are interconnected by electrode layers such that a plurality of voltages are available from a single device similar to embodiment 8C00. In another variation (not shown) the adjacent multilayer subcells are interconnected by charge transfer layers in a manner similar to embodiment 8D00. In all of the variations (not shown) of embodiment 900 described herein, the metallic/non-metallic composite cathode such as disclosed in Forrest '436 may be used in place of the highly transparent, low resistance non-metallic cathode. In this case the fourth organic layer of each subcell, 906a, 906b, 906c, and/or 906d, may be eliminated, if desired.

In yet another embodiment (not shown) one or both of the outer pair of organic layers in the subcells is replaced with a thin layer, approximately 50–150 Å, of Mg:Ag alloy which acts as a charge transfer, extraction, and protective cap layer.

It should be noted that in all of the stacked devices so far discussed, e.g., unilayer, bilayer, and multilayer, the thicknesses of all the subunits in any given device may be uniform, i.e., substantially the same from one subcell or subunit to the next. In particular, the thicknesses of the photoconductive organic layers which perform photoconversion are approximately the same in each subunit. However, since the photosensitive layers absorb electromagnetic radiation, the intensity of radiation admitted on one side, e.g., the top, of a stacked device decreases as the radiation traverses deeper into the device. The voltage generated by each cell or subcell is generally a function of certain intrinsic properties, e.g., the energy level distributions in the respective materials forming the heterojunction and in particular the HOMO-LUMO gap as previously discussed herein. However, the current generated in a cell or subcell depends on the amount of electromagnetic radiation which is admitted to the particular cell or subcell. In a stacked device composed of multiple subcells of uniform thickness and exposed to ambient electromagnetic radiation from only one direction, the current generated by subcells farther from the admission surface, or face, of the stacked device will decrease in cells progressively farther from the face. In stacked devices which are configured to be electrically connected in parallel, e.g., embodiments 8A00 and 900, this would not necessarily be a major drawback since the currents are combined externally to supply a current equal to the sum of that from all subcells with the voltage fixed by the intrinsic uniform voltage of the subcells. In such parallel devices the total power output of each subcell may be extracted without any inefficiency due to limitation by a particular subcell. In situations where it is desirable to obtain multiple outputs having the same current capacity, devices may be constructed as described below.

On the other hand, the different current limitation in each subcell may be an important factor in the operation of series connected stacked devices. In a stacked device which is connected in series such as embodiment 8D00, fundamental current continuity considerations constrain the device's current output so that it is limited to the current which goes through the subcell generating the least current regardless of the relative position of a subcell in the stack. To address this problem, other embodiments of the present invention utilize subcells having photoconductive organic layers with thicknesses which vary systematically between subcells.

For example, in a variation of embodiment 8D00, the photoconductive organic layers vary in thickness such that each subcell has exponentially thicker photoconductive organic layers if measured starting at the top of the device. This last variation of embodiment 8D00 would be most appropriate where the source of the electromagnetic radiation is limited to one side of the device, here the top, i.e., farthest from the substrate. In another variation, the photoconductive organic layers may be made exponentially thicker starting from the bottom subcell. This embodiment would be appropriate in an environment where the source of electromagnetic radiation is on the substrate side of the device when the substrate is transparent. For uniformly illuminated enviroments where approximately equal intensity electromagnetic radiation light is incident on the two faces of a device, yet another variation of embodiment 8D00 may be efficient. If the electromagnetic radiation has sufficient intensity that a significant amount of the radiation incident upon each face is able to traverse the device, then an embodiment variation of 8D00 wherein the photoconductive organic layers in the subcells in the center are thicker than corresponding layers in subcells nearer the two faces will provide uniform current levels from each cell.

The situation with series stacked devices which generate multiple independently accessible voltages, e.g., 8C00, is somewhat more complicated. In such a device, the currents through different subcells in the device may be different since the multiple external connections to the various internal electrodes allow multiple paths for current to flow so the effect of low current production by any particular subcell depends on the load dynamics.

In other embodiments of the present invention multiple layers of organic photosensitive materials are used to enhance device sensitivity. In one embodiment, organic photosensitive optoelectronic devices in accord with the present invention incorporate multilayer photoconductor layers to enhance exciton dissociation. Specifically it is believed that the presence of numerous well defined interfaces between materials provide more extensive exciton dissociation regions. The composite layers may have thicknesses commensurate with the device guidelines described above or thinner layers as described next.

Figure 10A:
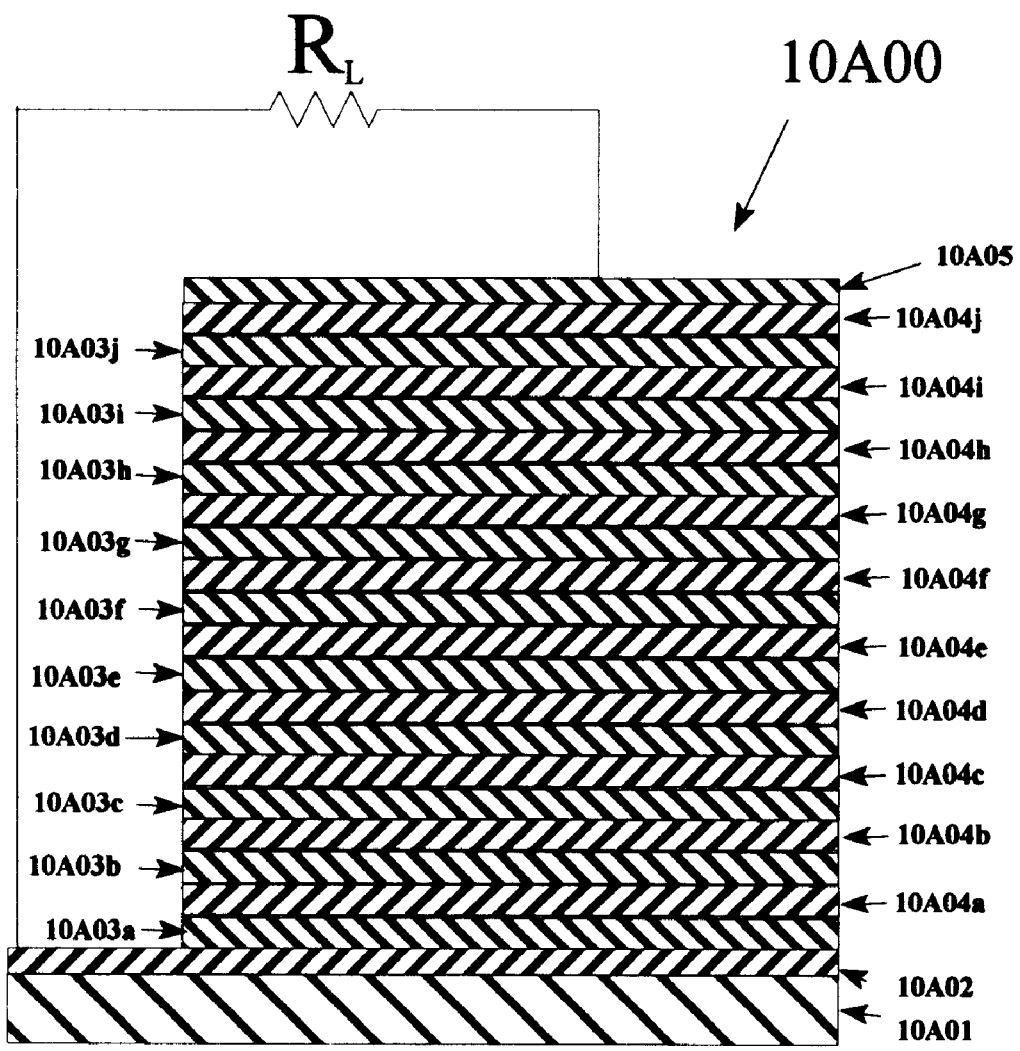
FIGS. 10A and 10B schematically depict organic photosensitive optoelectronic devices employing multiple stacked photoconductive layers.
Figure 10B:
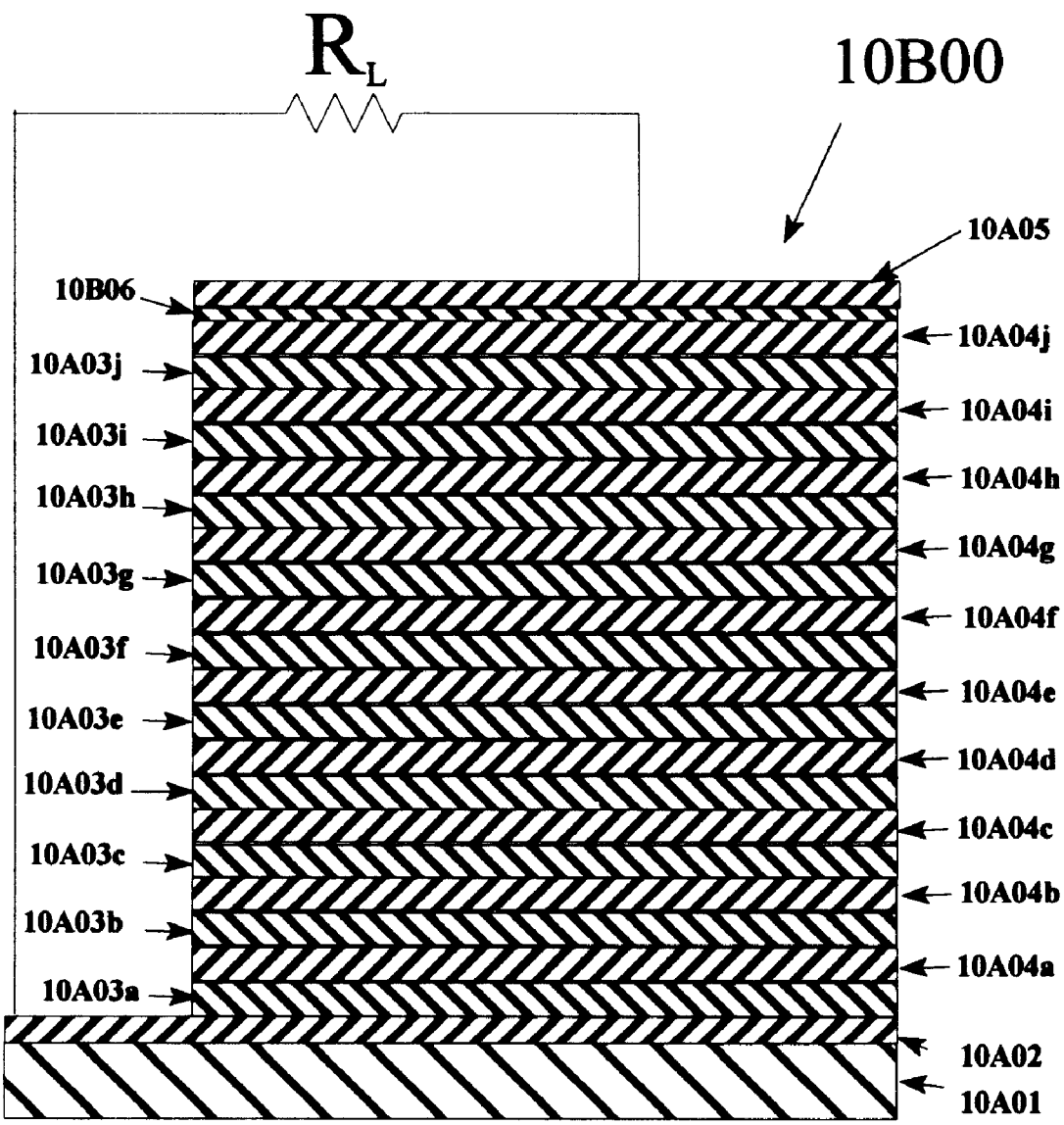

In yet a further embodiment, organic photosensitive optoelectronic devices in accord with the present invention incorporate multiple quantum wells (MQWs). MQWs are believed to alter the distribution of exciton energy levels resulting in, inter alia, possible changes in the spectral sensitivity of MQW-containing devices as compared to devices having the same materials and thicker photosensitive layers that do not exhibit quantum size effects. Also, it is believed that the changes in exciton energy levels may serve to enhance exciton dissociation. It is believed that these embodiments having multiple photosensitive layers including MQW structures provide enhanced photosensitivity but may not be appropriate for continuous use since they can quickly saturate due to charge which becomes trapped in the layers. Therefore, in an exemplary use organic photosensitive optoelectronic devices in accord with the present invention and incorporating MQWs would be used as intermittant photodetectors with, for example, a liquid crystal shutter mechanism which would periodically block light for short intervals from the detector so as to allow the trapped charge to dissipate. Such structures may be operated with a purely passive load as depicted in FIGS. 10A and 10B. However, these multilayer structures are highly efficient when operated with an applied bias. Under such conditions such a device can produce a large transient current when initially exposed to light.

Arbour et al. describes bilayer and multilayer assemblies of vanadyl phthalocyanine (VOPc) and PTCDA using semi-transparent Au or $SnO_2$ thin films as one contact, and transparent electrolytes, saturated in a redox species for the opposing electrical contact. It is appreciated that Arbour did not utilize solid state electrode materials suitable for practical devices for both electrical contacts. Also, it is appreciated that Arbour's multilayer devices did not have intervening electrodes or charge transfer layers as disclosed herein above. Forrest Chem. Rev further describes the effect of multiple layers of organic photosensitive materials but does not disclose the use of such layers in devices having two transparent electrodes.

Embodiments with numerous well defined interfaces and/or MQWs are now described with reference to FIG. 10A and FIG. 10B. FIG. 10A schematically depicts a device 10A00 with two electrodes 10A02 and 10A05, which are, e.g., ITO of approximate thickness 1000–4000 Å, preferably less than 2000 Å and most preferably around 1000 Å. For this embodiment, the bottom ITO electrode preferably functions as the anode and the top electrode functions as the cathode. For example, the top ITO electrode may be sputter deposited onto the underlying organic layer so as to form a low resistance non-metallic cathode or, alternatively, the top electrode 10A05 may be comprised of a thin Mg:Ag layer onto which the ITO layer is sputter deposited so as to form a metallic/non-metallic composite cathode. The layers 10A03(*a, b, c, d, e, f, g, h, i,* and *j*) and 10A04(*a, b, c, d, e, f, g, h, i,* and *j*) are pairs of organic photoconductive materials which form a plurality of interfaces between each respective 10A03 and 10A04 pair. The layers may be organic molecular crystal semiconducting materials as described elsewhere herein or polymer semiconductors as also described herein. For example, in one embodiment the pairs may be, e.g., PTCDA/CuPc, PTCBI/CuPc, or PTCDA/VOPc. Note also that the layer pairs need not necessarily be of different majority carrier type but may be isotype. The important feature of the layer pairs is that they produce numerous interfaces to promote and in some cases alter exciton dissociation dynamics. Layers of the exemplary materials just mentioned may be in the range of approximately 20–1000 Å with 500 Å being the preferred upper end of the range. Devices designed specifically to utilize MQW effects will have much thinner layers with thicknesses determined by the approximate spatial dimensions of the primary excitonic modes. These considerations are discussed in Forrest Chem. Rev. 1997 which is incorporated herein by reference. For the materials mentioned above, PTCDA/CuPc, PTCBI/CuPc, and PTCDA/VOPc, MQW layers should be in the 20–50 Å range. Embodiment 10B00 in FIG. 10B is a variation of 10A00 having an additional thin metallic layer 10B06 of, e.g., 50–150 Å of Mg:Ag alloy which acts as a charge transfer, extraction, and protective cap layer and forms a metallic/non-metallic composite electrode with the metal substitute ITO layer 10A05.

It is appreciated that in these devices the photoconductive layer materials may be deposited with either member of the pair on top as long as the layers are alternated throughout the device. Further, it is appreciated that the number of pairs depicted is illustrative only and may be more or fewer depending upon the thicknesses of the photoconductive layers. The general constraint again is that the total thickness of all the layers should not generally be greater than the penetration length of the electromagnetic radiation for which the device is to be utilized.

Figure 11A:
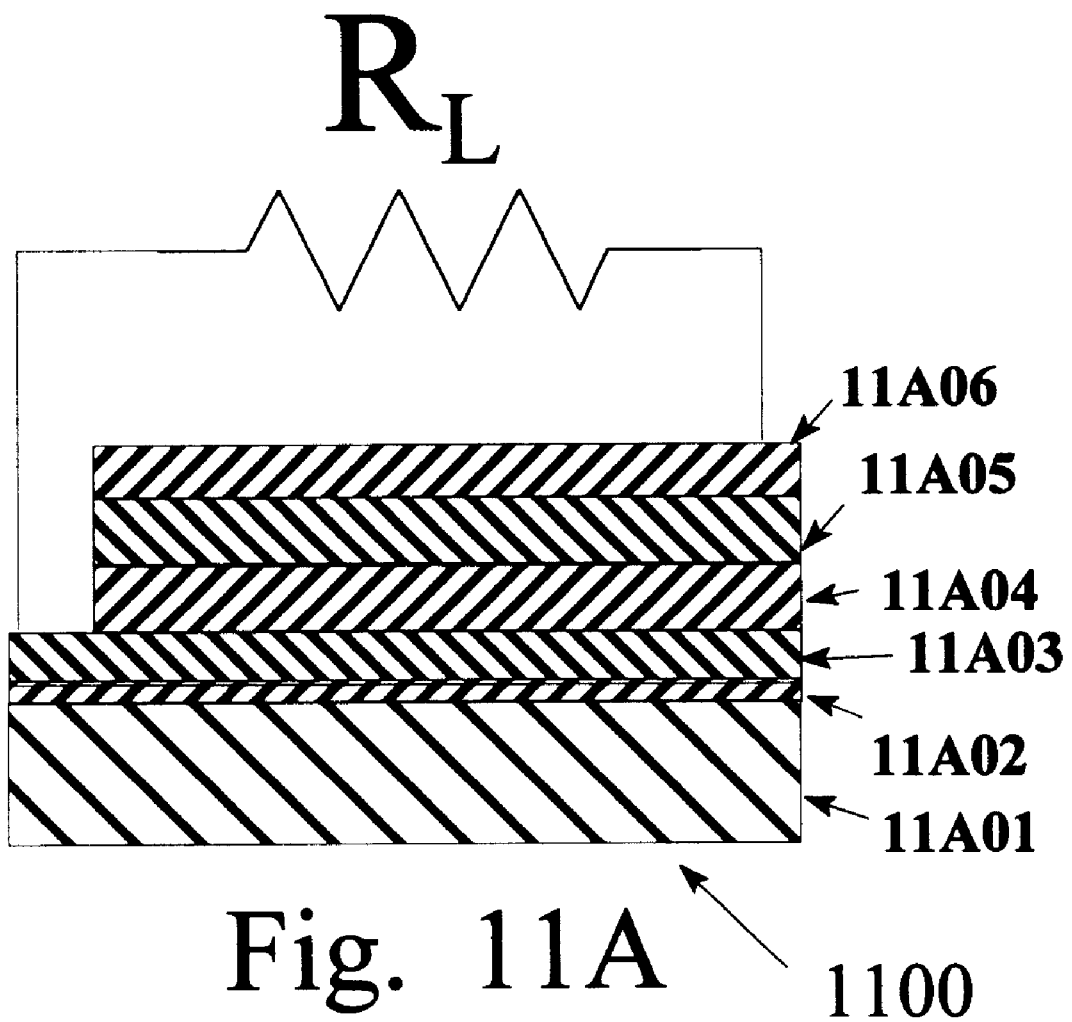
FIGS. 11A and 11B schematically depict organic photosensitive devices utilizing reflective layers.
Figure 11B:
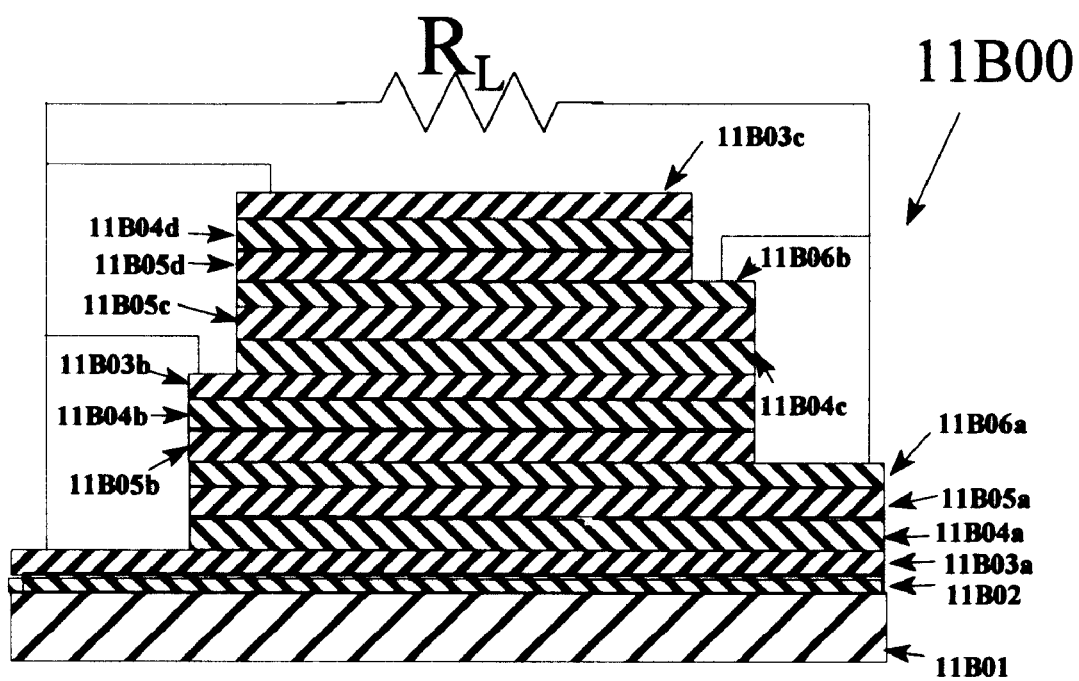

In yet a further exemplary embodiment, a reflective substrate of, e.g., metal, or a non-reflective substrate coated with a reflective layer of, e.g., metal such as Al or Au, may be used to support organic photosensitive optoelectronic device structures in accordance with the present invention. FIG. 11A depicts an example of an embodiment with a reflective surface based on a single bilayer cell. 11A01 is a substrate, which may be transparent, e.g., glass, or non-transparent, e.g., a metal. Thin metal layer 11A02 is deposited on the substrate. Layer 11A03 is an optional metal substitute electrode layer, for example, ITO. If layer 11A03 is not used then layer 11A02 functions as an electrode and is of a suitable material as described elsewhere herein. First organic layer 11A04 is an organic semiconductor, for example, CuPc. Second organic layer 11A05 is a second organic semiconductor, for example, PTCDA or PTCBI. The transparent electrode 11A06 that is placed on top is preferably a low resistance non-metallic cathode or a metallic/non-metallic composite cathode. FIG. 11B shows a stacked bilayer device embodiment with a reflective bottom layer with the subcells connected in parallel. 11B01 is a substrate, which may be transparent, e.g., glass, or non-transparent, e.g., a metal. If a glass substrate is used, thin metal layer 11B02 may be deposited on the substrate. Since a metal substrate or metal layer is present to provide the reflective surface, the metal substrate or metal layer also preferably functions as the bottom electrode of the device. However, if desired, an optional transparent electrode layer 11B03a comprised of ITO may be present. Layers 11B03(b and c) are subcell first electrode layers and may be a metal substitute such as ITO, a transparent metal, or comprise ITO over a thin metallic layer, such as Mg—Ag. Layers 11B06(a and b) are subcell second electrode layers and may be a metal substitute such as ITO, a transparent metal, or comprise ITO over a thin metallic layer, such as Mg—Ag. Organic layers 11B04(a, b, c and d) are a first organic semiconductor, e.g., CuPc. Organic layers 11B05(a, b, c and d) are a second organic semiconductor, for example, PTCDA or PTCBI. In another embodiment (not depicted), a transparent substrate is used to support any organic photosensitive optoelectronic device in accord with the present invention. In this embodiment the top subcell of the stack has a top reflective layer, typically and all intervening subcells have transparent electrodes and light is received through the substrate. The top reflective layer can be an electrode or a metallic layer deposited on a transparent non-metallic electrode. In all of these embodiments, i.e., with either a top or a bottom reflecting surface, the reflective surface redirects any unabsorbed light back through the absorbing layers to allow further opportunity for photoconversion and enhancement of the quantum efficiency. Inclusion of a reflective layer reduces the number of subcells required in a stack to obtain optimal photoconversion efficiency.

In fabricating practical organic photosensitive optoelectronic devices, in addition to determining the optimal number of and thickness of layers to have in a stacked photosensitive optoelectronic device as discussed above, the area and arrangement of individual cells may be chosen to optimize efficiency and cost. Since the transparent electrodes that are to be used in these devices do have some residual absorption, it is preferable to keep such electrodes thin to minimize this absorption. In addition, keeping the electrode layers as thin as practicable minimizes fabrication time. On the other hand, as all electrode materials are made thinner, their sheet resistance increases. Therefore, it is preferable to minimize the distance which charge carriers must travel in the electrode after collection. A configuration which maximizes photosensitive optoelectronic receptive area and accomplishes this goal is one in which the devices are laid out in long strips on the substrate with electrical connection made to the devices electrodes along the longer sides. U.S. patent application Ser. No. 08/976,666 to Forrest et al. (hereinafter Forrest Appl. '666), which is incorporated herein by reference in its entirety, describes techniques for fabrication of practical organic thin film devices.

Parthasarathy Appl. '707 disclosed that small molecular organic materials with relatively large planar molecules and a highly conjugated structure, such as CuPc and PTCDA, are believed to be able to withstand energetic electrode deposition because of the highly delocalized nature of their bonding which spreads the energy of impact over more than one bond. When an energetic metal or oxygen atom is incident on one of these molecules at a surface during sputtering, the energy of impact is thought to be efficiently distributed over the numerous bonds in the molecular π-electron systems. In contrast, no comparably large π-electron systems exist in, e.g., $Alq_3$ or α-NPD. For such molecules, the impact energy is more localized among only a few atomic sites, thereby increasing the probability for breaking a molecular bond. The planar or nearly planar stacking arrangements of crystalline molecular systems such as CuPc and PTCDA may also assist in the dissipation of energy among several neighboring molecules in the lattice. Accordingly, it is believed that the low resistance non-metallic cathode such as disclosed in Parthasarathy Appl. '707 can also be embodied in other similar types of small molecular crystals. For example, CuPc may be replaced by other metal phthalocyanines, aphthalocyanines and porphyrins. PTCDA may be replaced for example by other polyacenes. Some other representative photosensitive optoelectronic small molecule organic heterostructure combinations contemplated as suitable for use in accord with the present invention are shown in Table 1.

TABLE 1

Ag/PTCBI/CuPc/ITO
In/PTCDA/CuPc/ITO
Au/$H_2$Pc/DM-PTCDI/ITO
Au/$H_2$Pc/DM-PTCDI/PTCBI/ITO
Au/$H_2$Pc/PTCBI/ITO
Al/ZnPc/Au
Au/ZnPc/DM-PTCDI/ITO
In/PPEI/PVP(TPD)/ITO
Au/CuPc/DM-PTCDI/ITO
Au/ZnPc/DM-PTCDI/ITO
Au/$H_2$Pc/PTCBI/ITO
Au/TPP/DM-PTCDI/ITO
Au/TBP/DM-PTCDI/ITO
Au/$H_2$Hc/DM-PTCDI/ITO
Au/$H_2$Pc/DM-PTCDI/ITO
(Au/$H_2$Pc/DM-PTCDI)$_2$/ITO
Au/($H_2$Pc/DM-PTCDI)$_2$/ITO
Al/$C_{60}$/TiOPc/ITO
Al/$C_{60}$/VOPc/ITO

TABLE 1-continued

Al/C$_{60}$/PPV/ITO
Al/merocyanine/Ag

PPEO: 3,4,9,10-perylenetetracarboxyl-N,N'-bis(phenylethylimide).
PVP(TPD): 55 wt % N,N'-diphenyl-N,N'-ditolylbenzidine in poly (vinylpyridine) spin coated onto ITO surface prior to PPEI deposition.
TPP: 5,10,15,20-21H,23H-tetraphenylporphyrin.
TBP: tetrabenzoporphyrin (29H,31H-tetrabenzo[2,3-b:2'3'-g:2",3"-1:2"',3"'-q]porphyrazine).
H$_2$Nc: naphthalocyanine (29H,31H-tetranaphtho[2,3-b:2'3'-g:2",3"-1:2"', 3"'-q]porphyrazine).
H$_2$Pc: phthalocyanine
PPV: poly(phenylene vinylene).
ZnPc: zinc phthalocyanine
DM-PTCDI:
TiOPc: titanium oxide phthalocyanine
C$_{60}$: buckminsterfullerene
VOPc: vanadyl phthalocyanine Additionally, organic polymers may be used in accord with the present invention. Yu, G., Gao, J, Yang, C., and Heeger, A., "Photovoltaic Cells Made with Organic Composites ", Proceedings of the 1st NREL Conference on Future Generation Photovoltaic Technologies, American Institute of physics, March 1997, incorporated herein by reference in its entirety, discloses polymer-based solar cells using pure poly(2-methoxy-5-(2'-ethyl-hexyloxy)-1,4-phenylene vinylene) (MEH-PPV) and MEH-PPV blended with buckminsterfullerene (C$_{60}$). These materials are believed to be suitable as photoconducting materials in accord with the present invention. Also, "The Handbook of Conducting Polymers", Skotheim, T., Ed., Marcel Dekker, 1986, especially Chapter 17: Polymeric Semiconductor Contacts and Photovoltaic Applications" Kanicki, J., discloses a number of photoconductive polymers which are known in the art and which are believed to be suitable for use in devices made in accord with the present invention. These include poly-2-vinylpyridine (PVP), polyphenylacetylene (PPA), polyphenylene (PPP), polyphenylene sulfide (PPS), polypyrrole (PPY), polyacrylonitrile (PAN), polyheptadiyne (PHD), polymethylacetylene (PMA), polyphenylene vinylene (PPPV), polyphenylene oxide (PPPO). These materials may be incorporated in any of the several stacked photocell embodiments disclosed above. Also, it is believed that polymers that have a highly connected structure can form the low resistance non-metallic cathode by receiving an energetically deposited metal substitute cathode, such as sputtered ITO, when such an electrode/semiconductor interface would otherwise form a substantial barrier to carrier flow.

Also, it will be appreciated that the novel concept of electrically connecting organic photosensitive optoelectronic devices in parallel to overcome the inefficiencies associated with their high series resistance and related space charge effects is equally applicable to other organic photosensitive optoelectronic devices comprising other subcell compositions. Similarly the novel concept of connecting stacked organic photosensitive optoelectronic devices in series with external connections to intervening electrodes to provide a multivoltage power supply is applicable to other organic photosensitive optoelectronic devices. Also, use of the low resistance non-metallic cathode disclosed in co-pending Paratharathy Appl. '707 in place of a traditional semi-transparent metallic cathode, such as disclosed in prior art organic photosensitive optoelectronic material configurations, is intended to be within the scope of the present invention.

Figure 12:
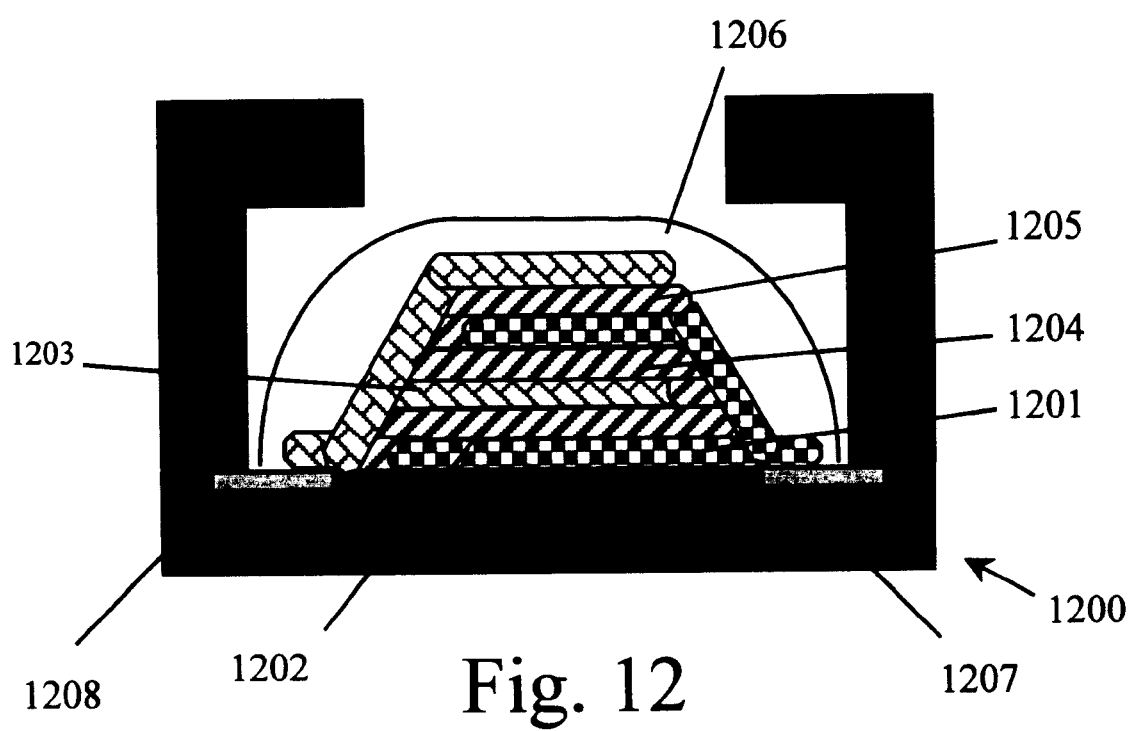
FIG. 12 is a stacked photosensitive optoelectronic device with parallel interconnection of subunits after fabrication in a more realistic depiction.

General techniques for fabrication of devices in accord with the present invention are well-known in the art. The preferred method of depositing the organic layers is by thermal evaporation; the preferred method of depositing metal layers is by thermal or electron-beam evaporation; the preferred method of depositing dielectrics is by plasma-enhanced chemical vaporization, RF or RF/DC sputtering, or electron-beam evaporation. The fabrication of the organic photosensitive optoelectronic devices may be accomplished, for example, with either a shadow masking technique or shadow masking combined with a dry etching process for preforming the substrate. Shadow masking and dry etching are known in the art. Advanced photolithographic deposition techniques for production of the various embodiments of the present invention have been previously disclosed in relation to the fabrication of organic thin films in Forrest Appl. '666. For example, one of ordinary skill in the art can construct the device embodiment as depicted in FIG. 12 using the techniques described in Forrest Appl. '666 and incorporated herein with the further benefit of this disclosure.

FIG. 12 depicts an implementation of a stacked photosensitive optoelectronic device having three subcells with subcells connected electronically in parallel. Embodiment 1200 is depicted within the "shadow box" after the step of encapsulation as described in Forrest Appl. '666. 1201 is a continuous region of a transparent conductive material, e.g., ITO which forms a bottom electrode and one electrode in the middle of the stack. Layer 1202 is a plurality of photoconductive organic layers (depicted as one here for convenience) which form a rectifying junction in accord with the present invention. 1203 is another continuous region of transparent conductive material, e.g., ITO which forms a top electrode and one electrode in the middle of the stacked device. Layers 1204 and 1205 are similarly pluralities of photoconductive organic layers. It is appreciated that in this embodiment there are three subcells which are deposited so as to have alternating polarity, i.e., the top and bottom subcells have the same polarity and the middle subcell has the opposite polarity. It is appreciated in embodiment 1200 that the photoconductive organic layers 1202, 1204 and 1205 are intended to be continuously connected. The organic materials contemplated for use in this particular embodiment are sufficiently poor conductors that they can effectively insulate the transparent conductive regions 1201 and 1203 from each other as depicted and still perform the photoconductive functions described elsewhere herein.

Protective layer 1206 should be made of a nonconductive material. For example, the protective layer could be spin coated polymer, such as TEFLON™, or sputter deposited SiO$_2$ or Si$_3$N$_4$. Protective layer 1206 should also be transparent when electromagnetic radiation is to be admitted through the top of the device. In another optional embodiment (not illustrated), protective layer 1206 may be omitted but the top electrode layers must be made thick as to be impervious to ambient atmosphere to protect the organic materials comprising the device from performance degrading chemical reactions.

Using the "shadow box" technique a stacked bilayer organic photosensitive optoelectronic device similar to FIG. 12 can be made in the following steps:

1) Depositing a transparent 5–10 μm dielectric layer onto a substrate with prepatterned contacts. The dielectric layer can be SiO$_2$, for example.
2) Depositing a photoresist layer.
3) Exposing the photoresist layer to light in a pattern for device bottom layers.
4) Removing unexposed photoresist areas to leave a pattern of photoresist over the dielectric layer.

5) Remove the dielectric layer by, e.g., chloride reactive-ion etching to leave strips of dielectric covered with photoresist and wet etching to create the "undercut".
6) Angle deposit a first ITO layer.
7) Angle deposit a CuPc layer.
8) Angle deposit a PTCDA layer.
9) Angle deposit a second ITO layer.
10) Angle deposit a PTCDA layer.
11) Angle deposit a CuPc layer.
12) Angle deposit a second ITO layer.
13) Repeat steps 7–12 to build up stack. The stacking can be stopped on repetition of either step 9 or 12.

Using a conventional shadow masking technique a stacked bilayer organic photosensitive optoelectronic device similar to FIG. 12 can be made in the following steps:

1) Deposit a first ITO layer by shadow masking onto a substrate with prepatterned contacts.
2) Deposit a CuPc layer by shadow masking.
3) Deposit a PTCDA layer by shadow masking.
4) Deposit a second ITO layer by shadow masking.
5) Deposit a PTCDA layer by shadow masking.
6) Deposit a CuPc layer by shadow masking.
7) Deposit a second ITO layer by shadow masking.
8) Repeat steps 2–7 to build up stack. The stacking can be stopped on repetition of either step 4 or 7.

Forrest Appl. '666 also describes techniques for fabricating arrays of optoelectronic devices which are also applicable to the present invention. With these techniques described in Forrest Appl. '666 and this disclosure one of ordinary skill can construct an array (not depicted) of organic photosensitive optoelectronic devices which is particularly suitable as a multipixel photodetector. Such an array is capable of detecting electromagnetic radiation with spatial and intensity resolution.

It will also be appreciated that the substrate may be any smooth material such as transparent materials glass, quartz, sapphire or plastic, or opaque materials such as silicon or metal and including flexible material such as plastic films, e.g., polystyrene, or metal foils, e.g., aluminum foil. Any roughness present on the surface of the substrate can be smoothed by depositing an optional thin layer of polymer on top of the substrate, or by applying a similar smoothing technique. Though the exemplary embodiments generally describe organic photosensitive optoelectronic devices deposited onto insulating substrates, it will be appreciated that if a conductive metal is used as the substrate it may be used as a first electrode in lieu of an applied first electrode. Alternatively, an insulating layer of, e.g., an insulating oxide, may be placed over the metal before the device is deposited as described in the above exemplary fabrication method.

The organic photosensitive devices of the present invention may be incorporated into, inter alia: light powered radios, televisions, computers, calculators, telephones and other wireless communications devices, watches, emergency location devices, electric vehicles, power generation systems and devices, and emergency power supplies; monitoring and detection equipment for power and/or sensing, inspection devices, radiation detectors, imaging devices; and optical coupling devices for electrical isolation or use in fiber optic communications.

Those skilled in the art will recognize that the devices described above may be used as solar cells or photodetectors. That is, when such a device is exposed to electromagnetic radiation while a bias voltage is applied, the device is in photodetector mode and a current is produced that correlates with the intensity of the incident radiation. In solar cell operation, no bias voltage is applied and power is directed through an external load. Accordingly, the present invention and claims are intended to cover these devices regardless of which of these modes is used when operating the device.

Thus, there has been described and illustrated herein an organic photosensitive optoelectronic device and method for producing the same. Those skilled in the art, however, will recognize that many modifications and variations besides those specifically mentioned may be made in the apparatus and techniques described herein without departing substantially from the concept of the present invention. Accordingly, it should be clearly understood that the form of the present invention as described herein is exemplary only and is not intended as a limitation on the scope of the present invention.

What is claimed is:

1. An organic photosensitive optoelectronic device comprising:

a substrate having a first major surface and a second major surface;

two transparent metal substitute electrode layers in superposed relationship upon said first major surface of said substrate; and four photoconductive organic layers, having an inner pair and an outer pair, disposed between said two transparent metal substitute electrode layers, wherein said inner pair of said four photoconductive organic layers consists of a pair of photoconductive organic layers selected to form a photovoltaic heterojunction and selected to have spectral sensitivity in a specified region of the electromagnetic spectrum, and wherein said inner pair of said four photoconductive organic layers comprises aluminum tris(8-hydroxyquinoline) and 4,4'-bis[N-(1-napthyl)-N-phenyl-amino]biphenyl.

2. The device of claim 1 wherein each of said outer pair of said four photoconductive organic layers comprises a material selected from the group consisting of copper phthalocyanine, perylenetetracarboxylic dianhydride and 3,4,9,10-perylenetetracarboxylic-bis-benzimidazole.

3. An organic photosensitive optoelectronic device comprising:

a substrate having a first major surface and a second major surface;

two transparent electrode layers in superposed relationship upon said first major surface of said substrate; and only one pair of photoconductive organic layers selected to form a photovoltaic heterojunction disposed between said two electrode layers, wherein the only one pair of photoconductive organic layers is selected from the group consisting of a copper phthalocyanine layer with a perylenetetracarboxylic dianhydride layer, and a copper phthalocyanine layer with a 3,4,9,10-perylenetetracarboxylic-bis-benzimidazole layer.

4. The device of claim 3 wherein the pair of photoconductive organic layers consists of a copper phthalocyanine layer with a perylenetetracarboxylic dianhydride layer.

5. The device of claim 3 wherein the pair of photoconductive organic layers consists of a copper phthalocyanine layer with a 3,4,9,10-perylenetetracarboxylic-bis-benzimidazole layer.

6. The device of claim 3 wherein said transparent electrode layers consist of a conductive oxide.

7. The device of claim 6 wherein said conductive oxide is selected from the group consisting of indium tin oxide, tin oxide, gallium indium oxide, zinc oxide and zinc indium oxide.

8. The device of claim 7 wherein said transparent electrode layers consist of a conductive polymer.

9. The device of claim 8 wherein said conductive polymer consists of polyaniline.

* * * * *